United States Patent [19]
DeMars et al.

[11] Patent Number: 6,122,299
[45] Date of Patent: Sep. 19, 2000

[54] ANGLED DISTRIBUTED REFLECTOR OPTICAL DEVICE WITH ENHANCED LIGHT CONFINEMENT

[75] Inventors: Scott D. DeMars, Milpitas; Robert J. Lang, Pleasanton; Alexander Schoenfelder, Cupertino, all of Calif.

[73] Assignee: SDL, Inc., San Jose, Calif.

[21] Appl. No.: 09/001,769

[22] Filed: Dec. 31, 1997

[51] Int. Cl.$^7$ .............................. H01S 3/085; G02B 6/26
[52] U.S. Cl. .................. 372/20; 372/21; 372/45; 372/46; 372/50; 372/92; 372/103; 385/14; 385/28; 385/37; 385/50
[58] Field of Search .................. 372/103, 20–22, 372/92, 50, 45, 46, 96; 385/14, 28, 37, 39, 50

[56] References Cited

U.S. PATENT DOCUMENTS

| | | | |
|---|---|---|---|
| Re. 35,215 | 4/1996 | Waarts et al. | 372/108 |
| 3,884,549 | 5/1975 | Wang et al. | 350/96 |
| 4,658,403 | 4/1987 | Takiguchi et al. | 372/96 |
| 4,713,821 | 12/1987 | Bradford et al. | 372/44 |
| 4,744,089 | 5/1988 | Montroll et al. | 372/50 |
| 4,789,881 | 12/1988 | Alphonse | 357/17 |
| 4,799,223 | 1/1989 | Streifer et al. | 372/24 |
| 4,803,696 | 2/1989 | Pepper et al. | 372/95 |
| 4,815,084 | 3/1989 | Scifres et al. | 372/46 |
| 4,831,630 | 5/1989 | Scifres et al. | 372/50 |
| 4,856,017 | 8/1989 | Ungar | 372/96 |
| 4,942,366 | 7/1990 | Toda | 330/4.3 |
| 4,977,567 | 12/1990 | Hanke | 372/45 |
| 5,103,456 | 4/1992 | Scifres et al. | 372/50 |
| 5,140,149 | 8/1992 | Sakata et al. | 385/50 |
| 5,164,955 | 11/1992 | Meyers | 372/96 |
| 5,164,956 | 11/1992 | Lang | 372/96 |
| 5,185,752 | 2/1993 | Welch et al. | 372/22 |

(List continued on next page.)

OTHER PUBLICATIONS

"Dynamic Optical Grating for Laser Beam Steering Applications", *OSA Proceedings of the International Topical Meeting on Photonic Switching*, Held in Salt Lake City, Utah on Mar. 6–8, 1992, vol. 8, pp. 272–274.

"Transverse Mode Selection in InGaAsP Lasers with Dielectric–coated Mirrors", *Technology Physics Letters (USA)*, Mar. 1995, vol. 21, No. 3, pp. 195–197.

"Subpicosecond Pulse Amplification in Semiconductor Laser Amplifiers", *IEEE Lasers and Electro–Optics Society 1993 Annual Meeting*, CAt. No. 93CH3297-9, Nov. 15–18, 1993.

*Primary Examiner*—James W. Davie
*Attorney, Agent, or Firm*—W. Douglas Carothers, Jr.

[57] ABSTRACT

A optical medium, such as an angled distributed reflector, e.g., an angular grating, or α-DFB laser diode or a waveguide wavelength selective filter, has a mean optical axis defining an optical cavity for substantially confined light propagation within the device. An angular grating is provided in at least a portion of the optical cavity forming a grating region permitting light to propagate along the optical cavity in two coupled waves or modes incident along the angular grating, a first incident propagating wave substantially parallel with respect to the mean optical axis and a second incident propagating wave at an angle with respect to the mean optical axis. At least one preferential coupling region in the optical cavity at an interface or boundary with the grating region to receive both propagating waves and provide for preferential treatment to the first incident propagating wave by coupling propagating light in the second incident propagating wave into the first incident propagating wave prior to light output from the medium via the non-grating region, forming a boundary with the grating region. The angle of the boundary at the interface of these respective regions is chosen to be substantially collinear with a propagation direction of the second incident propagating wave so that propagating light in the second incident propagating wave will substantially enter the preferential coupling region from the grating region via the boundary in a propagation direction substantially parallel with the mean optical axis.

88 Claims, 12 Drawing Sheets

U.S. PATENT DOCUMENTS

| | | | |
|---|---|---|---|
| 5,185,754 | 2/1993 | Craig et al. | 372/45 |
| 5,228,049 | 7/1993 | Paoli | 372/50 |
| 5,231,642 | 7/1993 | Scifres et al. | 372/45 |
| 5,247,528 | 9/1993 | Shinozaki et al. | 372/22 |
| 5,271,024 | 12/1993 | Huber | 372/6 |
| 5,276,702 | 1/1994 | Meliga | 372/96 |
| 5,321,718 | 6/1994 | Waarts et al. | 372/108 |
| 5,337,328 | 8/1994 | Lang et al. | 372/45 |
| 5,345,466 | 9/1994 | Macomber | 372/96 |
| 5,349,602 | 9/1994 | Mehuys et al. | 372/98 |
| 5,357,538 | 10/1994 | Talneau et al. | 372/96 |
| 5,379,318 | 1/1995 | Weber | 372/96 |
| 5,392,308 | 2/1995 | Welch et al. | 372/92 |
| 5,461,692 | 10/1995 | Nagel | 385/127 |
| 5,499,256 | 3/1996 | Bischel et al. | 372/28 |
| 5,499,261 | 3/1996 | Welch et al. | 372/50 |
| 5,504,772 | 4/1996 | Deacon et al. | 372/102 |
| 5,511,083 | 4/1996 | D'Amato et al. | 372/6 |
| 5,513,196 | 4/1996 | Bischel et al. | 372/22 |
| 5,517,517 | 5/1996 | Liou | 372/50 |
| 5,530,709 | 6/1996 | Waarts et al. | 372/6 |
| 5,644,584 | 7/1997 | Nam et al. | 372/20 |
| 6,014,396 | 1/2000 | Osinski et al. | 372/46 |
| 6,028,973 | 2/2000 | Schienle et al. | 385/50 |

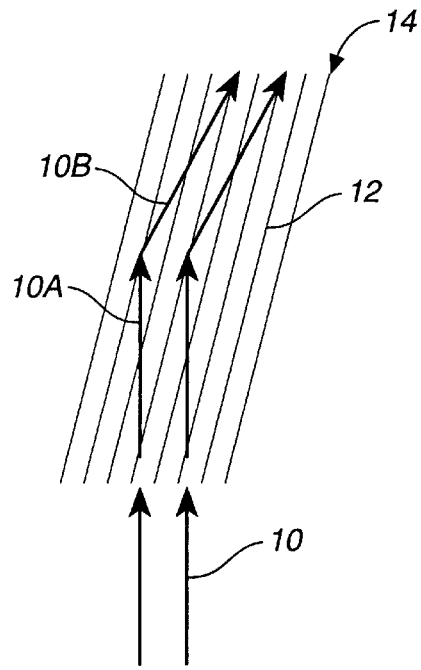
FIG._1
(PRIOR ART)
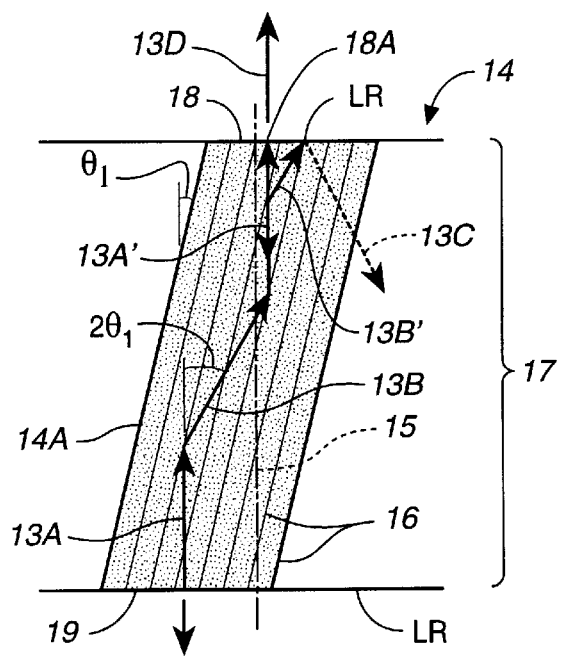
FIG._2
(PRIOR ART)

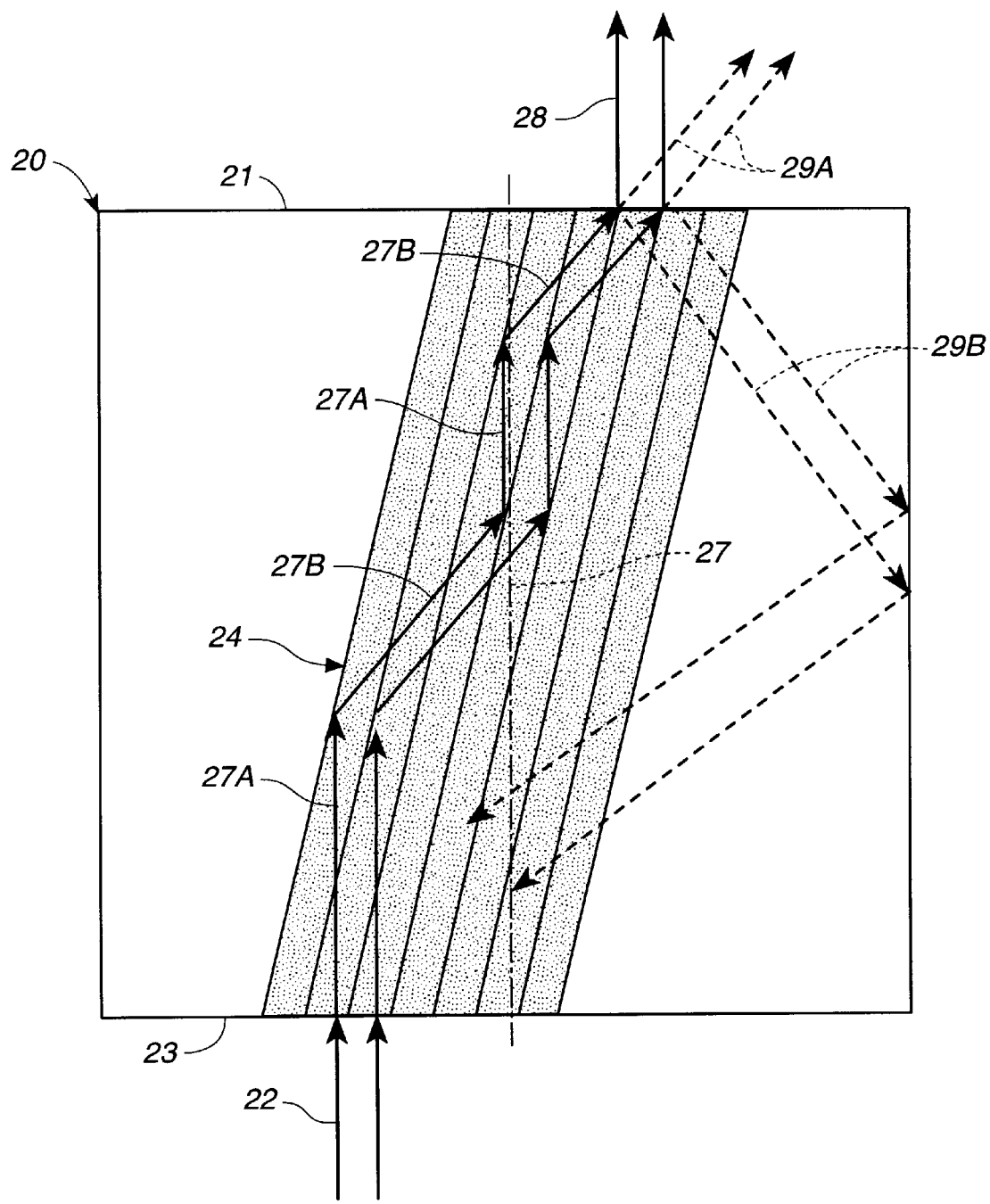
FIG._3
*(PRIOR ART)*

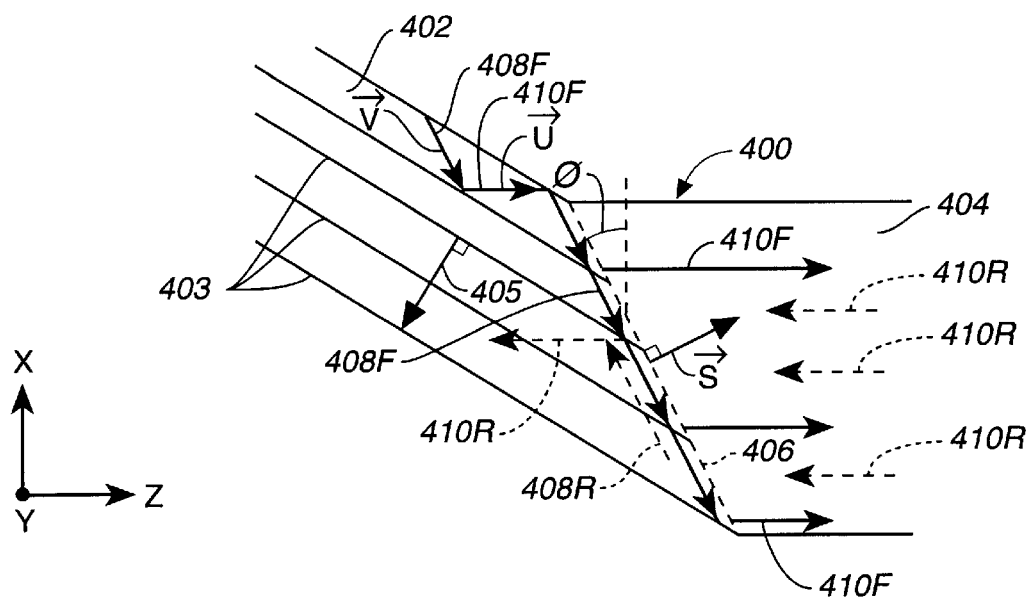
FIG._4
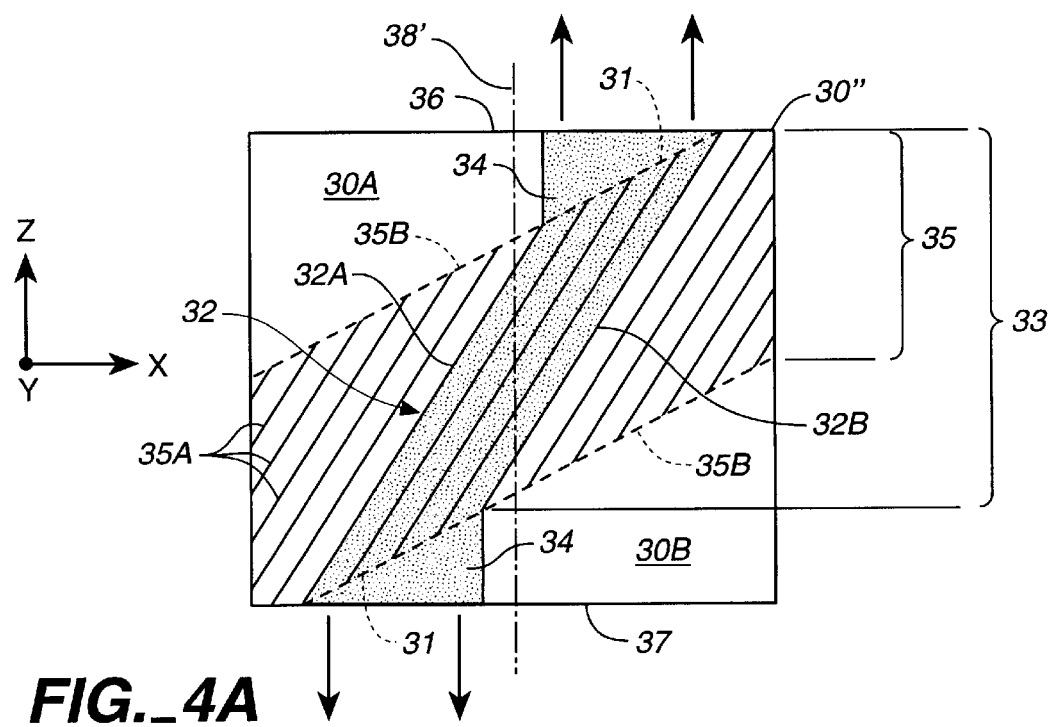
FIG._4A

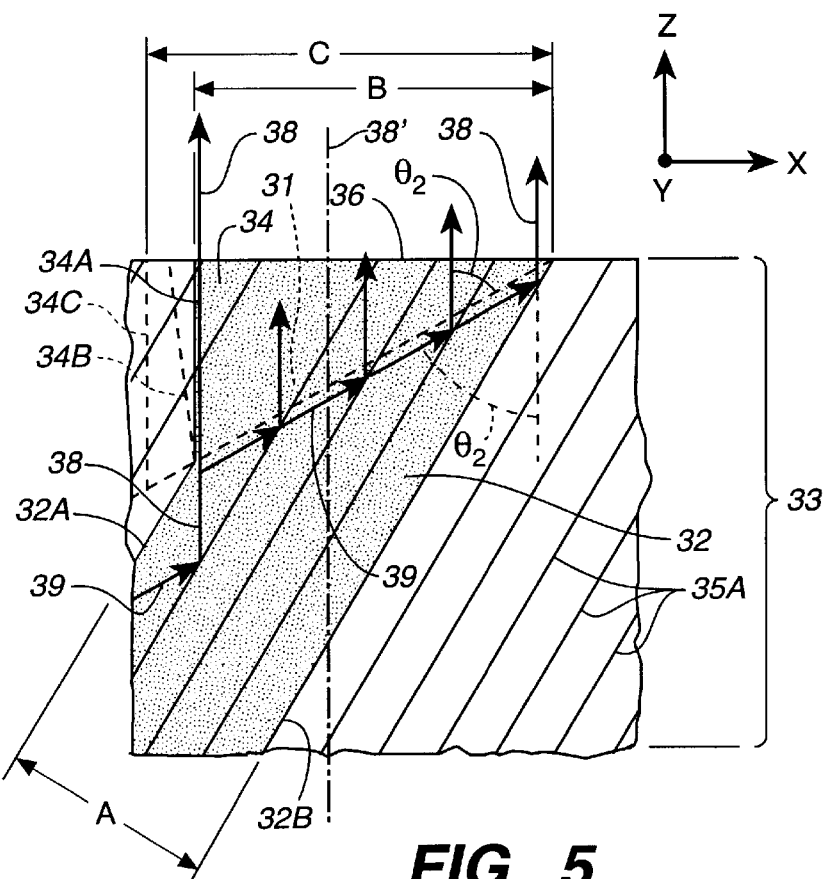
FIG._5
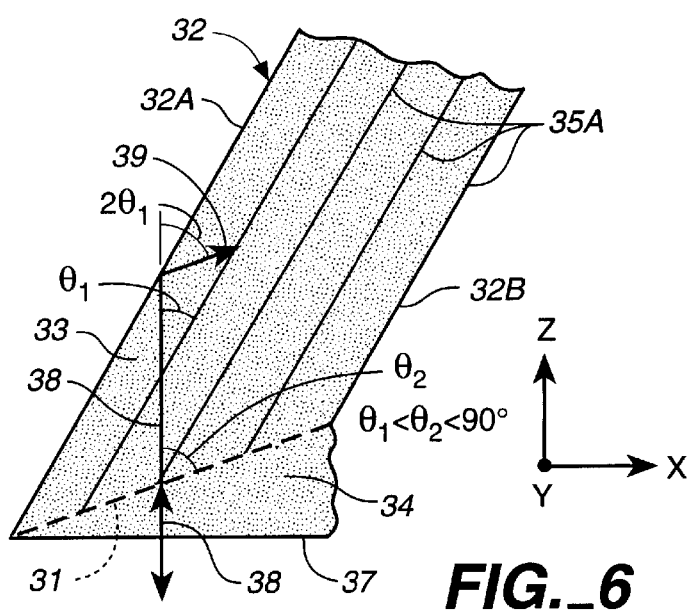
FIG._6

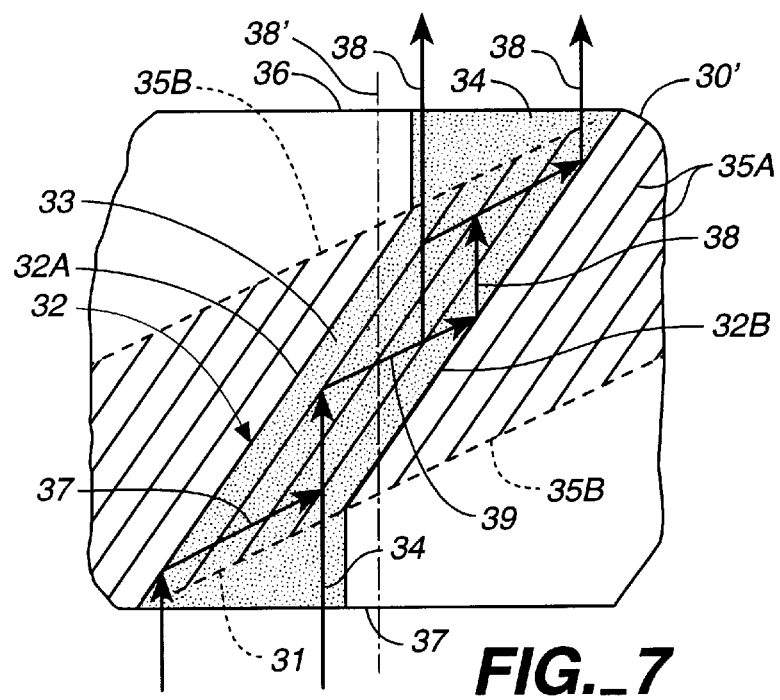
FIG._7
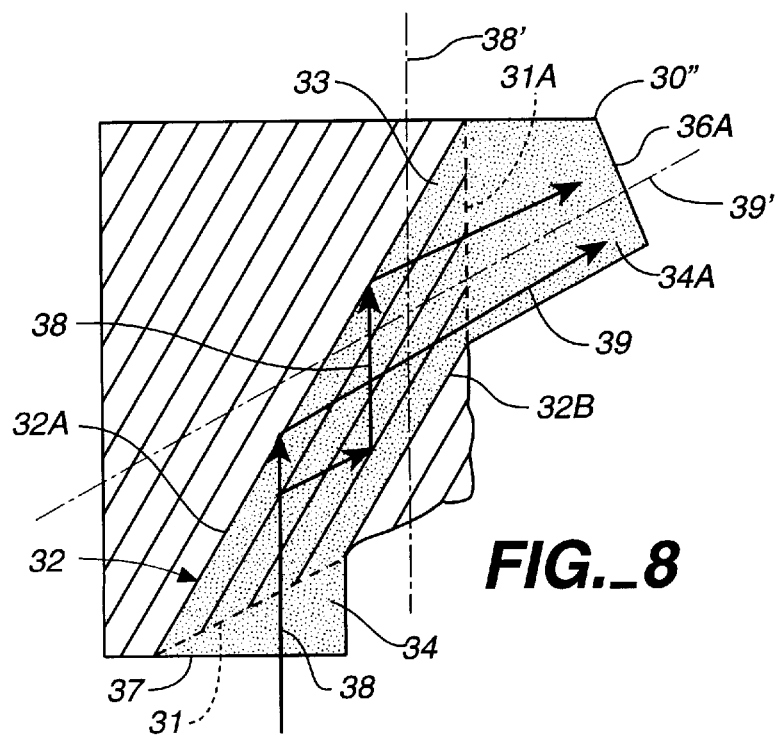
FIG._8

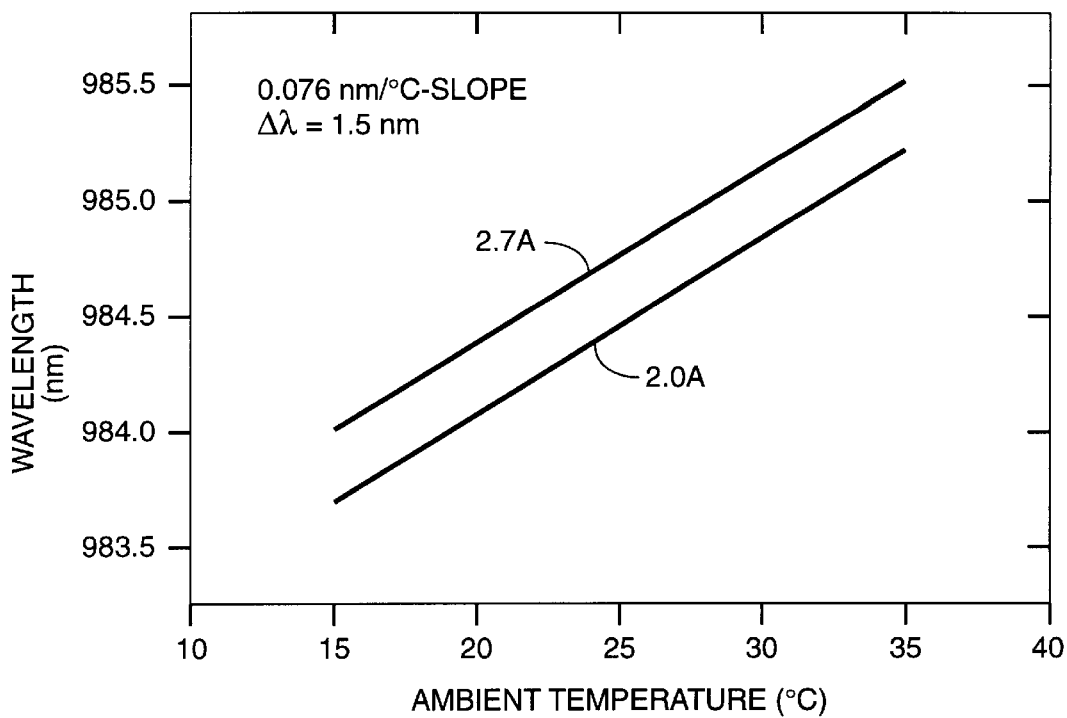
FIG._9
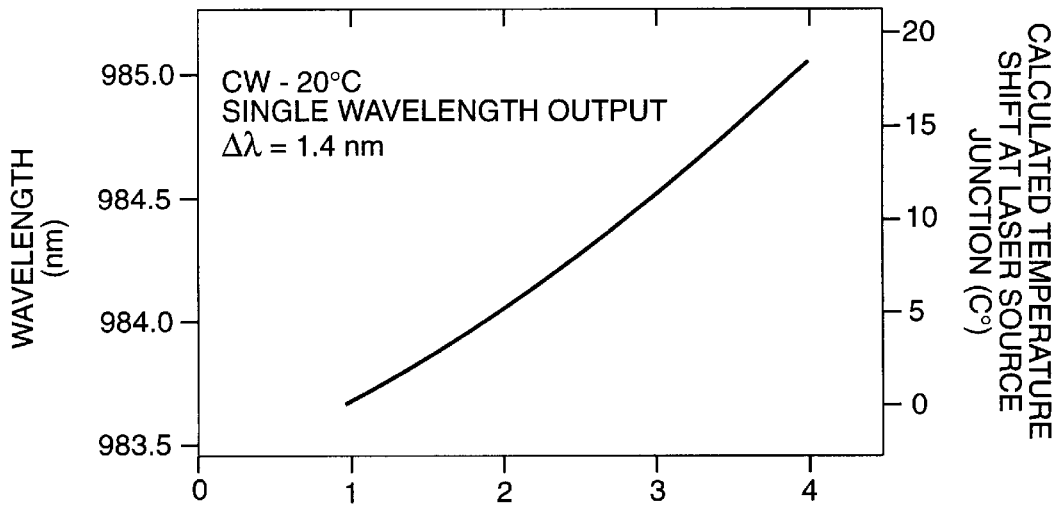
FIG._10

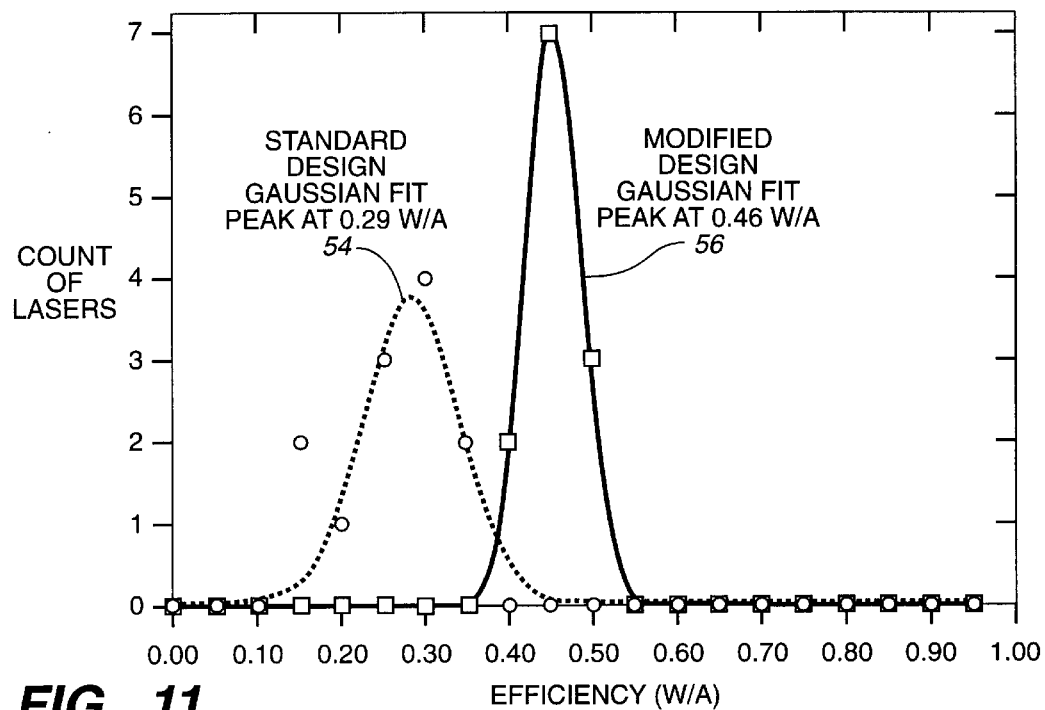
FIG._11
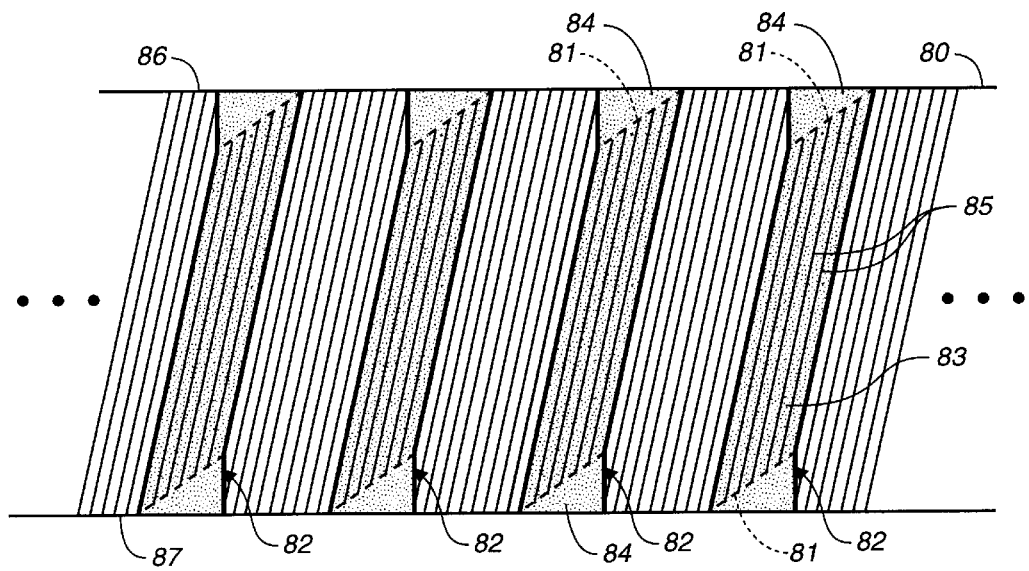
FIG._14

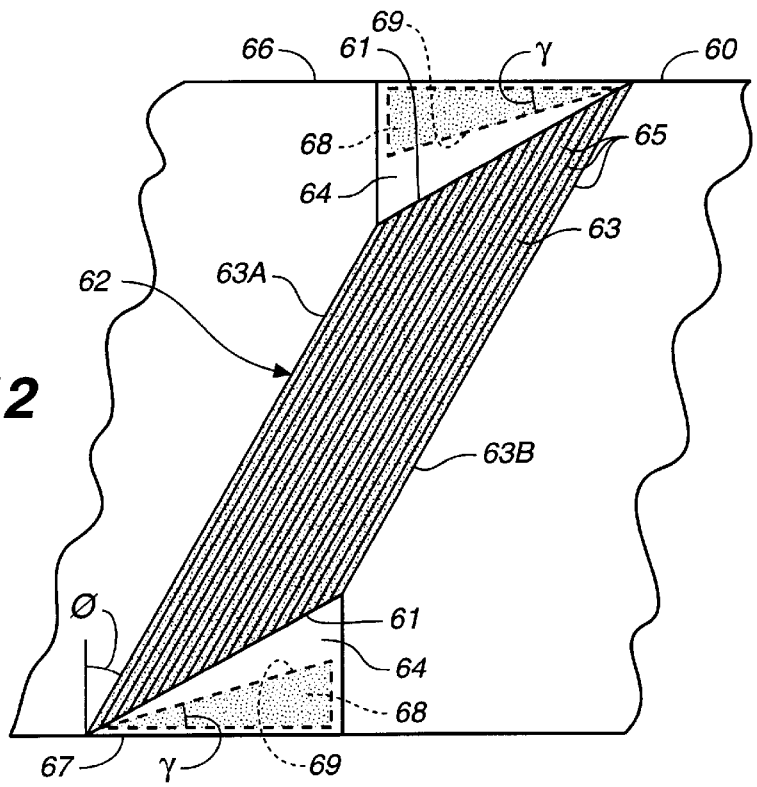
FIG._12
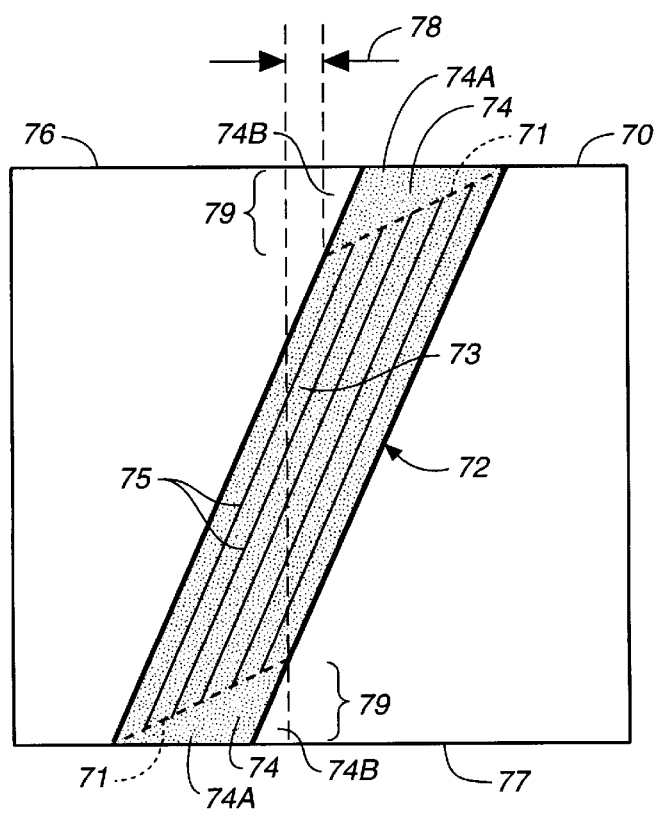
FIG._13

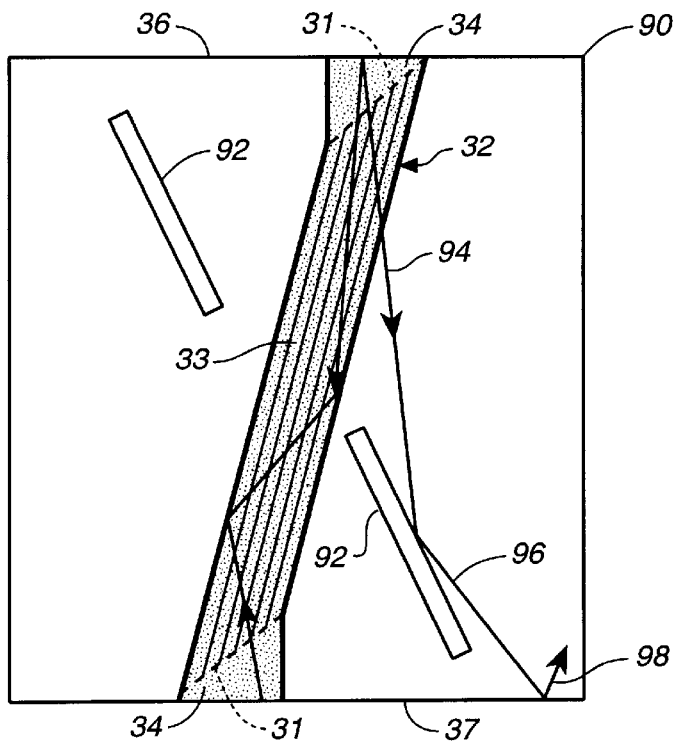
FIG._15
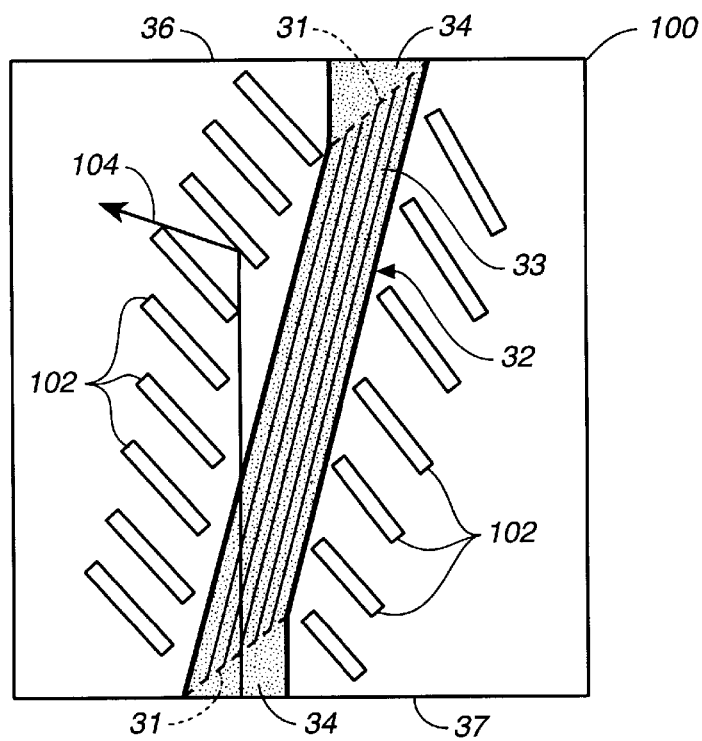
FIG._16

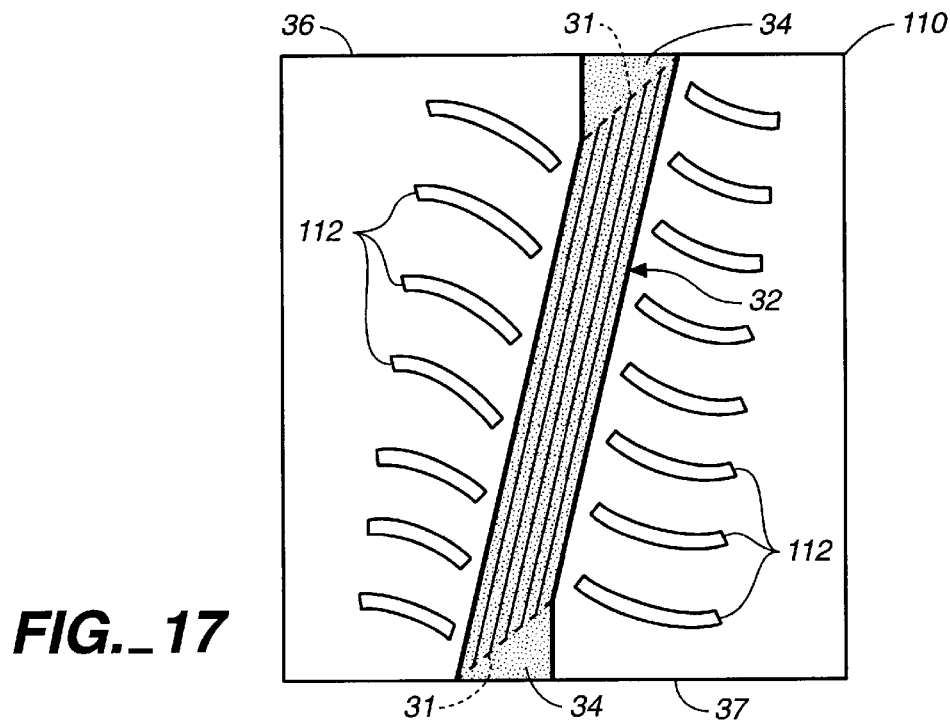
FIG._17
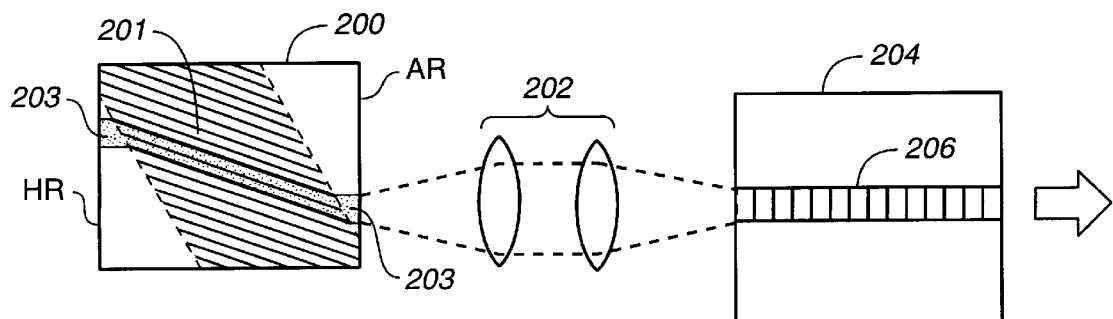
FIG._20

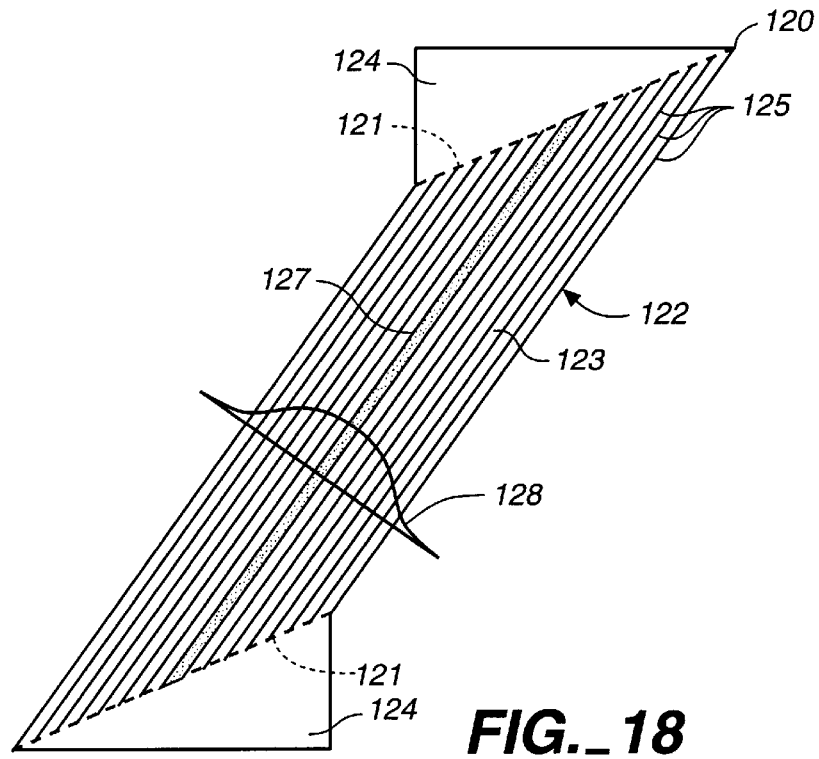
FIG._18
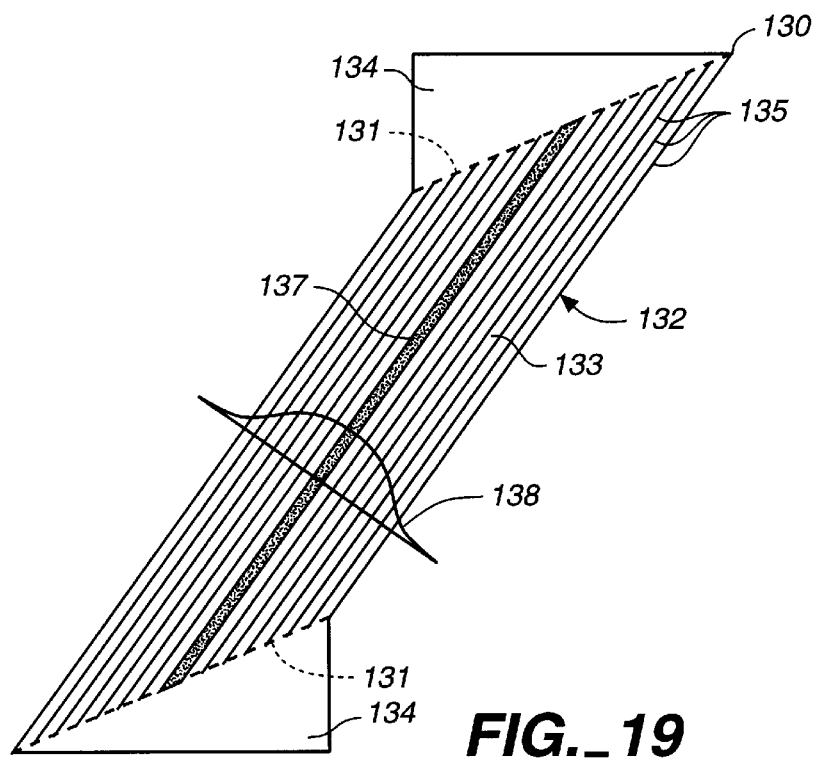
FIG._19

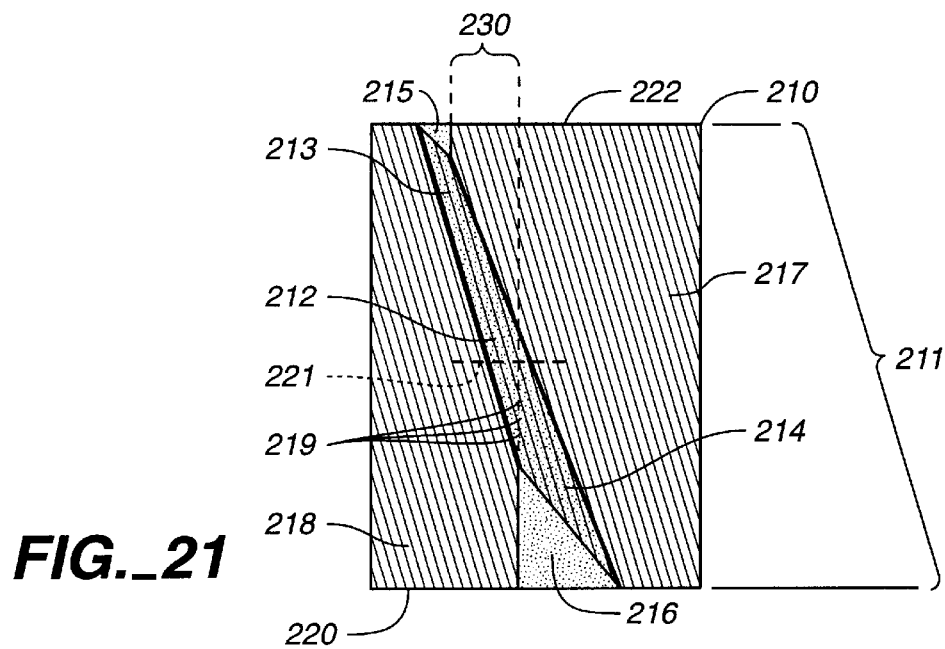
FIG._21
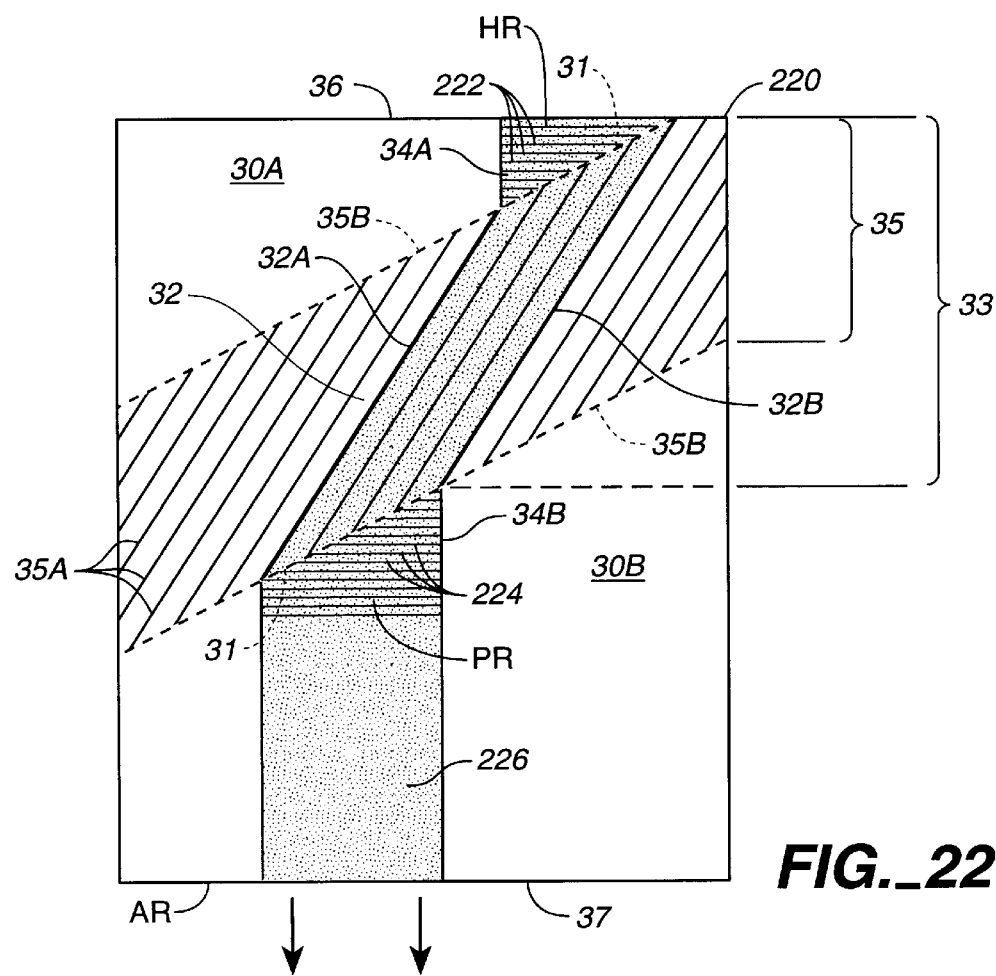
FIG._22

ANGLED DISTRIBUTED REFLECTOR OPTICAL DEVICE WITH ENHANCED LIGHT CONFINEMENT

FEDERALLY SPONSORED RESEARCH AND DEVELOPMENT

The invention was supported under Government Contract No. F29601-95-C-0035 through Department of the U.S. Air Force and Government Contract No. DAAH04-95-C-0004 through the Ballistics Missile Defense Organization U.S. Army Research Office. The government has certain rights to the invention.

FIELD OF THE INVENTION

This invention relates generally to angled distributed reflector optical media and, more particularly, to improvements in radiation confinement and operational efficiency of devices utilizing such optical media.

BACKGROUND OF THE INVENTION

In a coherent light source, such as a solid-state laser, semiconductor laser or amplifier, it is advantageous to restrict the range of operational wavelengths that propagate within the radiation source. In particular, it is important in many applications to provide a laser device that will operate in single longitudinal mode, particularly in telecommunication applications where mode hopping in the laser operation cannot be tolerated. As a result, distributed feedback (DFB) semiconductor lasers and distributed Bragg reflector (DBR) semiconductor lasers have been continually redefined and developed to provide signal and pump sources for optical data communication systems that are wavelength reliable.

Longitudinal mode control alone is not sufficient to guarantee stable single wavelength output from DFB and DBR laser devices. The existence of multiple lateral modes in these devices, particularly those with a broad area gain region, can lead to a broadened spectral output as well as instabilities in the output beams spectral, spatial, and power characteristics, all of which limit the devices utility in the above mentioned application areas. The background of U.S. Pat. No. 5,337,328 to Lang et al. describes these limitations as arising from nonuniformities in spatial carrier densities and subsequent filamentation in broad area gain devices. In order to provide lateral mode control in DFB and DBR lasers, a lateral real refractive index waveguide, also referred to as a single mode filter, is typically introduced with a width of about 1 $\mu$m to about 5 $\mu$m restricting laser operation to a single lateral mode and stabilizing the device performance.

Despite the single-spatial and single-spectral mode control in DFB and DBR lasers, these devices are limited in output power to less than a couple hundred milliwatts due to carrier density limitations, due to optical power density limitations at the facets as a result of the narrow extent of the lateral waveguide, and due to significant internal losses of reflected light in the cavity propagating at large angles into nonpumped regions of the device where it is absorbed. In U.S. Pat. No. 5,103,456, Scifres et al. describe a master oscillator power amplifier (MOPA) device with a broad beam output that circumvents the aforementioned power limitations, yet provides comparable mode control and beam quality. Power in the output of this distributed reflector type laser has been enhanced, particularly for optical pumping applications, by means of forming a combination DBR single mode oscillator with a diverging or flared amplifier section forming the MOPA device. MOPA devices provide for more efficient pumping at higher power levels leading to greater signal amplification.

Present day MOPA devices, DFB lasers, and DBR lasers all exhibit certain characteristics that are unsuitable for signal and pumping applications. The geometric arrangement of the active stripe and gratings in these devices, for example, make the devices susceptible to the formation of parasitic grating-coupled modes and parasitic Fabry-Perot modes. Since the active stripe in these devices is oriented perpendicular to the end reflectors and the gratings support mode propagation along a path that is collinear with Fabry-Perot modes, these devices are susceptible to feedback noise that can change the operational characteristics of their output. In broad area lasers, such as a broad area DFB or DBR devices, or MOPA devices, all of which provide larger power outputs, multiple lateral modes may also operate and individual light filaments may develop along the path of propagation of radiation causing more stable operation at points of developed light filamentation. As a result, more spatial modes may develop resulting in nonuniform intensity in the output beam.

In order to eliminate or otherwise circumvent these problems, laser resonant cavities that include a wavelength selective mechanism in the form of a an angled distributed reflector have been proposed in the art to function, in part, as a spatial and spectral filter to improve spatial and spectral beam quality. Such devices are also referred to as angled grating laser sources or $\alpha$-DFB laser sources which have a broad area, angular resonant distributed reflector along at least a portion of the length of the optical resonant cavity with the grating reflector oriented at an angle relative to cavity end reflectors which define the resonant optical cavity. Such $\alpha$-DFB laser sources are disclosed in the aforementioned U.S. Pat. No. 5,337,328 to Lang et al., which is owned by the assignee herein and is incorporated by its reference.

In reference to the shortcomings described above relative to DFB, DBR, and MOPA devices, the angled distributed reflector in $\alpha$-DFB lasers provides a means to achieve spatial and spectral mode control in a broad area laser resonant cavity and, in addition, simultaneously provides suppression of filamentation as well as suppression of parasitic Fabry-Perot mode competition due to utilization of a preferred geometry that is noncollinear with Fabry-Perot modes.

An example of a resonant distributed reflector that provides very narrow, i.e. selective, spectral and spatial band-pass filtering is a Bragg grating. In a "reflector" configuration, in which light is confined to a region by the gratings, unwanted spectral and spatial components of the light are transmitted through the grating. Such a configuration is well suited to the purposes of providing light output of a single spatial and spectral mode at a given wavelength of operation. Differing purposes may call for a weak grating implementation of a resonant distributed reflector or for a notch filtering configuration. However, the following discussion concentrates on the Bragg grating implementation in order to remain within conceptual framework established in conjunction with this disclosure.

A Bragg grating is a comprised of a periodic or nearly periodic array of partially reflective structures or periodic perturbation that are interposed into the light path within the coherent source. A Bragg grating can be formed by periodic variations in index of refraction, gain, loss, or a combination thereof, and can be formed in a semiconductor bulk medium of the laser structure, within a planar waveguiding structure, within an optical fiber, or within a bulk optical medium by means well known in the art. Similarly, a Bragg grating may not necessarily be strictly periodic, but may include phase shifts, interrupted regions where the grating is enhanced, diminished, or eliminated, variations in grating strength (apodization), variations in period (chirped), or multiple periods, all of which permit modification of specific aspects of the spectral filtering function performed by the grating and which are all generally known in the art.

If the Bragg grating is formed in a bulk material, the periodic or near periodic structures are planar parallel or near parallel surfaces, while if the Bragg grating is formed in a planar waveguide, the periodic or near periodic structures are parallel or near parallel linear features formed within the waveguide. Collectively, these periodic or near periodic structures will be referred to as "grooves" of the grating pattern or grating.

In the Bragg grating, the phase-matching condition must be closely maintained, i.e., the relationship $$k_{out} \approx k_{in} + m k_B, \quad m = \pm 1, \pm 2, \pm 3 \tag{1}$$

is closely maintained or approximated, where $k_{in}$ is the wave vector of the light before reflection at the grating, $k_{out}$ is the wave vector of the light after reflection from the grating, and $k_B$ is the wavevector of the grating itself. Equation (1) is referred to and is known as the Bragg condition.

A used herein, the term, "angled distributed reflectors", is intended to include, but is not limited to, any structure composed of a collection of periodic or near periodic partial reflectors, which cause the light reflect therefrom, at least in part, due to a partial variation in the equivalent refractive index for light propagating in the region of the reflectors. Gratings and other similar perturbations are, therefore, a type of angled distributed reflector and they include pattern structures or a periodic perturbation employing etched grooves, periodic index variations, antiguides, dielectric stacks, periodic gain distributors and periodic loss distributors. Other angled distributed reflectors may be internally or externally formed optical cavity formed mirrors and the like. A Bragg type of grating is referred to throughout this description since it is a simple means of describing the multiple wave interaction that occurs between the propagating light and the grating. Moreover, the subject of this invention is not intended to be limited just to "light" waves, fixed gratings or strict Bragg gratings, as other sources of radiation or wave phenomena, other than "light", will work equally as well, and the gratings may be frequency tunable and need not precisely satisfy the Bragg condition or to be within the Bragg regime of diffraction. A Bragg grating pattern may be interposed in the light path with the grooves disposed perpendicularly to the light path, in which case the light that is reflected is directed back onto itself at a narrow range of angles and/or frequencies, such as in the case of broad area devices disclosed in U.S. Pat. Reissue No. 35,215 to Waarts et al. On the other hand, the grating grooves may be disposed at an angle to the light path, in which case, the light is deflected angularly over a narrow range of angles and frequencies. Examples of gratings employing an angled gratings are disclosed in U.S. Pat. No. 5,337,328 to Lang et al.

In angled grating or α-DFB laser sources in which a distributed Bragg reflector is employed, the reflectors are used not only to filter out undesirable light from the resonator, but also to manipulate the direction of travel of the desirable light. As shown in FIG. 1, when light 10 is incident upon an angled Bragg grating 12, which is the pumped gain region of laser 14, and the light closely satisfies the Bragg condition for reflection, then at any given position within the grating, there may be a mixture of deflected and undeflected light propagating within the grating in two different directions designated as 10A and 10B. As best seen in FIG. 2, light 13A at a designed wavelength traveling perpendicular to the resonant cavity end reflectors will be diffracted by the grating in directions and 13B. A second event of this diffraction is that the light is diffracted again in a direction normal to the cavity end reflectors and is now laterally displaced from its original path as indicated at 13A'. Note that 13A' and 13B' designate light in each of the two waves near each facet of the device, although, for simplicity, these wave vectors are only drawn near facet 18. Efficient operating of the coherent light source requires control over the amounts of light traveling in each direction 10A and 10B within grating 12, as shown in FIG. 1. For example, in the angled-grating laser 14 shown in FIG. 2, an angled grating 16 is disposed between two spatially separated, parallel reflectors 18 and 19 to form a pumped laser stripe 14A which is illustrated as a shaded area. The mean optical axis 15 of resonator 17 is basically perpendicular to facets 18 and 19 and the grooves of grating 16 are disposed at an angle $\theta_1$ relative to this mean optical axis 15. By "mean optical axis", we are referencing an arbitrary axis in relation to resonator 17 that is positioned approximately within and oriented approximately along the two grating-coupled waves, one at 13A comprising a wave propagating parallel to the facet normal and the other at 13B comprising a wave propagating at an angle with respect to the facet normal. The utilization of mean optical axis 15, which is perpendicular to facets 18 and 19, aids in discussing the present invention relative to the existing art relating angled distributed reflector optical devices. Within resonator 17, light that strikes the facet at 18A is reflected perpendicularly from the facet back into the cavity with a portion 13D thereof also exiting from the low reflecting (LR) facet 18 as shown. Still another portion 13B diffracts off of gratings 16 approximately at a light beam angle, $2\theta_1$, from optical axis of resonator 17. Thus, at either end of laser 14, the light beam consists of a mixture of light propagating parallel, such as at 13A and 13A', and light propagating at angle, $2\theta_1$, with respect to the facet normal such as at 13B and 13B', along mean optical axis 15 of resonator 17. Upon reflection from the facets 18 and 19, a portion of the light propagating parallel to mean optical axis 15 and will return back into the resonator still parallel an optical axis 15 and thus, will approximately satisfy the Bragg condition. However, upon reflection from facets 18 and 19, the portion of the light propagating approximately at angle $2\theta_1$ will be reflected into a direction that no longer satisfies the Bragg condition for reflection from the grating and, as a result, is lost in unpumped regions of laser 14, as illustrated at 13C. This lost light greatly diminishes the efficiency of laser 14 and is one principal reason why these angled grating lasers have not come into practical and commercial application even though they may operate with better spatial and spectral qualities compared to conventional and presently employed DFB, DBR and MOPA laser sources.

In the ideal device, the mode propagating perpendicular to facets 18 and 19 self-selects so that the total power at the lasing wavelength is carried by the first wave 13A' of the two-grating coupled waves 13A', 13B', which wave 13A' is propagating substantially parallel to the facet normal. Ideally, no power is present in the second wave 13B' propagating at an angle with respect to the facet normal. These coupled waves are both nearly Bragg matched to the gratings and continuously exchange power along the path of the pump stripe. Due to imperfections, for example, in the grating uniformity, the optical power is not completely coupled into the parallel first wave 13A' near or at the facets 18 and 19. Thus, at these cleaved facets 18 and 19, a portion of the light is lost from the optical cavity. In the case of an α-DFB laser, for example, this lost light is significant at higher operational powers and can lead to bleaching of the unpumped region, heating and feedback into the laser pumped region at the laser pump stripe, all of which disrupt laser performance.

While the configuration of FIG. 2 describes a laser device in which light travels bi-directionally through an angled reflector, an angled reflector may also be used in a single-pass configuration, e.g., as an optical amplifier (pumped gain medium) or as a passive spatial filter or tuning element (unpumped medium), such as illustrated by optical devices 20 in FIG. 3. Collectively, therefore, all these active and passive optical devices can be broadly referred to as "optical device(s)".

In FIG. 3, optical medium 20 comprises an angular grating pump or stripe region 24 wherein, as light 22 enters grating region 24 through rear facet 23, it is deflected in two different directions 27A and 27B along mean optical axis 27 so that a part of the light exits parallel with the direction of input or, as seen at 28, while another part is divided between a portion 29A in the direction of the deflected light 27B or a related direction as dictated by the law of refraction through the facet, which is lost in space, and a portion 29B in the reflected direction, which is lost into the unpumped region of the device.

It is the object of the present invention to improve the efficiency of optical devices in the form of lasers, amplifiers, passive filters and other optical waveguide devices employing angled distributed reflectors in their optical cavities so that they are more efficient in spatially and spectrally wave component selection.

It is the further object of the present invention to provide a means of improved control over the coupling efficiency between light beams propagating within a optical device via an angled distributed reflector structure and a wave transitional boundary and preferential coupling mechanism within the optical device.

SUMMARY OF THE INVENTION

According to this invention, an angular distributed optical medium having an angular reflector for controlling the spatial and/or spectral qualities of propagating light provides two coupled waves or modes comprising a first incident wave and a second incident wave along its length. A mechanism is provided in a region of the medium that allows preferential coupling of light into or out of one of the two modes, such as the first incident wave, near an interface of the medium, thereby reducing light lost through the other mode, i.e., the second incident wave. This mechanism takes the form of a boundary between a region containing the angular reflector and a region that is characterized by having no gratings within its boundary, or a reflector or grating of a different character from the angular reflector. The angle of the boundary between the grating region and the non-grating region is chosen to be collinear or nearly collinear with the propagation direction of the second incident wave so that the propagating light in the second incident wave will be substantially converted into the first incident wave before it crosses the boundary between the grating region and the non-grating region. The boundary may be coincident with the boundary of the optical medium containing the angular reflector or it may be an interface located within a single optical medium that contains both grating and non-grating regions.

In devices or systems that have at least one angled distributed reflector optical device, such as gratings, for example, and that rely upon the use of the diffraction phenomenon of waves from the gratings to fulfill one or more functions, the shape of a boundary or interface between regions of differing grating properties may be utilized to optimize the performance of the device or system. Optimization is performed so as to best achieve the desired function or functions, such as the achievement of a single spatial, or single spectral wave component as an output from the device or system, or the achievement of highest operational efficiency. In particular, gratings that are spatially distributed can lead to spatially distributed diffraction producing multiple waves which are components of the grating diffraction. Therefore, in the propagation of these waves from one region to another region of differing grating properties, the optimal shape of the transitional boundary between the regions is multiply dependent upon the spatial properties of the gratings, the spatially distributed strength of each subject wave component, and the desired function of the device or system. The importance in consideration of understanding the role of such a boundary has been overlooked by those practicing in this area of art in their design of angled grating-based devices in preference to the specific grating properties. Likewise, the inherent considerations in the design of a transitional boundary of the present invention is not generally defined or understood in the prior art. However, the impact of an appropriate transitional boundary on performance of the device function, as disclosed herein, can be just as critical as the selection of the grating properties such as orientation, period and modulation strength.

With respect to such angular distributed optical mediums, in particular prior angled distributed reflector optical devices with distributed reflectors in the form of an angled grating region along the optical cavity, there is always an incomplete conversion of waves of light into a preferred direction so that another portion of the light is in a direction in the device which ultimately served no useful purpose and degraded the performance and operation of the device. The present invention provides a way for coupling substantially all of the waves into substantially one direction within selected regions of the device which are referred to as preferential coupling regions A given preferential coupling region in the angled distributed reflector optical device lies adjacent to at least one angled grating region and along the light propagation path of at least one component of the grating coupled light in a direction that may be defined as the mean optical axis of the optical device. A boundary is formed between the angled grating region and the preferential coupling region. These regions are comprised of differing grating properties, e.g., respectively, a region that contains angularly disposed Bragg gratings, and a region that contains no gratings or the gratings therein that are modified in some manner relative to the gratings in the angled grating region. Preferential coupling occurs as the light enters or leaves the end portion of the angled reflector region by passing through the boundary into the preferential coupling region. By "preferential", we mean that the boundary of the preferential coupling region is disposed in the device in a manner to optimize coupling of the waves propagating into the given preferential coupling region of the device in a preferred direction of propagation along the mean optical axis while preventing non-preferred light from substantially entering this region or being generated in this region. The angle of disposition of the boundary region is defined relative to an arbitrary feature that is geometrically definable relative to the device, such as its mean optical axis. The angle of the boundary is chosen to preferentially couple light into at least one of several possible grating-coupled light propagating directions. The nominal angle of the angled boundary that provides preferential coupling is aligned to be along one of the grating-coupled light propagating directions, typically one of the non-preferred wave components. Since the boundary is parallel to the non-preferred wave component, at least one of the preferred wave components has an opportunity to pass through the boundary while the non-preferred wave component does not pass through the boundary. The presence of multiple gratings within a region, the various nonuniformities accidentally or purposely introduced into the grating, or the relationship between multiple spatially separate grating regions and angled interface, preferential coupling regions may cause the angle of each angled boundary to depart from the nominal angle.

A particularly important angled distributed reflector optical device is the angled DFB laser source, also referred to as an α-DFB laser, with a region having an angled distributed reflector in the form of a periodic grating wherein the light is alternately coupled between multiple wave components as they propagate along the region along the mean optical axis of the laser source. A resonator is created with the employment of reflectors defining an optical cavity therebetween with multiple wave components in the distributed reflector region being coupling into a preferred wave component at an angled interface between the distributed reflector region, and the preferential coupling region having no distributed reflector for light in the preferred direction that would deviate it from the direction which is most useful for output from the laser source.

Specifically, therefore, a boundary or interface exists between a non-grating region, positioned near at least one of the two facets of the laser source, and the grating region. An elongated pump stripe is provided for a portion of the grating and non-grating region to form an optical cavity for stimulated lasing emission, which cavity is disposed at an angle relative to the mean optical axis. Also, the pump stripe in the non-grating region may be slightly broaden, although this is not a requirement. The angle of the interface between the grating region and the non-grating region within the pump stripe is chosen to be collinear with one of the wave propagation directions so that this wave will not enter the non-grating region, instead only the light propagating in the other or preferred wave will substantially enter the non-grating region in a propagation direction nominally selected to be normal to the facet. As a result, light in the non-grating region will not be preferentially coupled as an angled wave or into an angled wave relative to the facet normal and may either reflect at the facet back into medium at an angle not efficiently captured by the cavity or exit through the facet of the optical cavity at a angle not useful for beam output applications. The pump stripe may then also be broadened to permit transfer and forward propagation of substantially all of the light in the optical cavity passing through the boundary in order for it to reach the output facet and contribute to the output beam.

Other inventive features are included in this disclosure relate to different pumping schemes and/or geometry for the preferential coupling regions including frequency tuning, different types of structural geometry for preventing preference to any parasitic grating-coupled modes or to Fabry-Perot modes, as well as application of the invention to laser diode arrays and frequency mixing applications. Also, other inventive features include the use of phase shift mechanism (in grating period or in refractive index) in the pump stripe, angled grating region of an α-DFB laser source to maximize conversion of power into a single wave component in the preferential coupling region at or near the output facet of an α-DFB laser source.

As used herein, the term, "optical device" means any device that includes a propagating light path that includes an angled distributed reflector, such as a Bragg grating as defined above, that may also include a resonator, such as in the case of an α-DFB laser source, or may include an amplifier function, such as a gain medium for amplifying an input signal that propagates the length of the device to its output, or may include a passive waveguide which does not include an active region but does employ angled distributed reflectors, such as passive filter elements that have a grating set to a desired wavelength which is filtered from input light to the device.

As used herein, the term, "reflector" is intended to include any periodic structure in bulk materials, planar waveguides, or circular waveguides for which the Bragg condition applies, and includes any periodic or nearly periodic structure or collection of structures comprised of etched grooves, index, gain, loss, or compositional variations, variations in crystal structure, electron or hole trapping. The Bragg grating reflector may be formed in solid state condition, such as formed in the crystal bulk, as well as in propagating condition, such as that produced by the acousto-optic effect in a traveling acoustic wave, or may be formed by electro-optic or photorefractive means as disclosed in the art.

Other objects and attainments together with a fuller understanding of the invention will become apparent and appreciated by referring to the following description and claims taken in conjunction with the accompanying drawings.

BRIEF DESCRIPTION OF THE DRAWINGS

FIG. 1 is a schematic diagram of waves propagating through an optical path in an angled Bragg grating reflector as is known in the art.

FIG. 2 is a schematic diagram of waves bidirectionally propagating through an optical path having an angled Bragg grating reflector of a laser source having a configuration that is inefficient in operation.

FIG. 3 is a schematic diagram of waves unidirectionally propagating through an optical path having an angled Bragg grating reflector of an optical device having a configuration that is inefficient in operation.

FIG. 4 is a schematic diagram of an angled distributed grating waveguide with a coupled preferential coupling region comprising the fundamental feature of this invention.

FIG. 4A is a schematic diagram of an angled distributed grating optical device functioning as an α-DFB laser source and having a preferential coupling region according to the present invention.

FIG. 5 is a more detailed schematic diagram of the preferential coupling region of FIG. 4A forming a boundary between a non-grating region and the grating region of the optical device.

FIG. 6 is an illustration of the angular relationship between the interface formed between the grating and non-grating regions and the gratings.

FIG. 7 is a schematic illustration of the light output of one of the two coupled waves, the wave shown being the parallel wave propagating in the grating region parallel with a reference axis.

FIG. 8 is a schematic illustration of the light output of one of the two coupled waves, the wave shown being the angled wave propagating in the grating region at an angle to a reference axis.

FIG. 9 is a graphic illustration of the wavelength versus ambient temperature characteristic at a given current operation of an α-DFB laser source according to the present invention.

FIG. 10 is a graphic illustration of the wavelength versus drive current characteristic at a given temperature of an α-DFB laser source according to the present invention.

FIG. 11 is a graphic illustration of a histogram showing the improvement in efficiency in α-DFB laser sources of the present invention over those of the prior art.

FIG. 12 is a schematic diagram of an α-DFB laser source of this invention with a first modified current pumping pattern in its preferential coupling regions.

FIG. 13 is a schematic diagram of an α-DFB laser source of this invention with a second modified current pumping pattern in its preferential coupling regions.

FIG. 14 is an α-DFB laser diode array comprising a plurality of laser emitters each having preferential coupling regions according to this invention.

FIG. 15 is a schematic illustration of a first mechanism for suppressing Fabry-Perot modes outside the optical cavity to further enhance the operational efficiency of an of α-DFB laser source according to this invention as well as those known in the art.

FIG. 16 is a schematic illustration of a second mechanism for suppressing Fabry-Perot modes outside the optical cavity to further enhance the operational efficiency of an α-DFB laser source according to this invention as well as those known in the art.

FIG. 17 is a schematic illustration of a third mechanism for suppressing Fabry-Perot modes in the optical cavity to further enhance the operational efficiency of an of an α-DFB laser source according to this invention as well as those known in the art.

FIG. 18 is a phase shifted α-DFB laser source according to this invention where a phase shift is implemented through displacement of the grating grooves over a portion of the pumped grating region.

FIG. 19 is a phase shifted α-DFB laser source according to this invention where the phase shift is implemented via a refractive index step over a portion of pumped grating region different from the refractive index in the remaining portions of the pumped grating region.

FIG. 20 is a schematic illustration of an application of an α-DFB laser source according to this invention for frequency mixing such as frequency doubling.

FIG. 21 is a schematic diagram of an angled Bragg grating reflector optical device with a tapered pump stripe and preferential coupling regions comprising this invention.

FIG. 22 is a schematic diagram of a α DFB laser source employing grating reflectors in the preferential coupling regions at opposite ends of the angled pumped region.

DETAILED DESCRIPTION OF THE PREFERRED EMBODIMENTS OF THE INVENTION

Reference is made now to FIG. 4 which illustrates a fundamental feature of this invention. This feature involves the coupling between waves and the passage of these waves between two different regions, each composed of a medium which supports the propagation of the waves. Optical medium 400 in FIG. 4 is a partial view of a first region 402 containing a periodic or near periodic structure or grating 403, such as, for example, a Bragg grating. Medium 400 also includes a second region 404, partially shown, in which the periodic or near periodic structure or grating is absent or modified in some way. One or more waves, such as waves 408F and 410F, extend or propagate through the boundary 406 between these regions 402 and 404. The directionality of each wave on either side of boundary 406 is dictated by the physical laws pertaining to differences in medium properties in first region 402 and second region 404, e.g., refraction in the case of optical waves in an optical supporting medium. Medium 400 in each of these two regions 402 and 404 may be altogether different, such as an air/solid combination of media. The edges of medium 400 in each region 402 and 404 may be a great distance from the partial view shown in FIG. 4 so that the waves are unaffected by the edge in approximation, i.e., the waves are not considered to be confined or guided by the medium as is the case, for example, in a three dimensional bulk material. In this unconfined condition, boundary 406 between regions 402 and 404 may be represented as a surface with some shape. The edges of medium 400 in one or both regions may be close to the partial view shown in FIG. 4 so that the waves are affected by the edge of the medium, i.e., the waves are confined or guided by the medium as is the case, for example, in a two dimensional waveguide. In this confined case, the boundary between regions 402 and 404 may be represented as a line with some shape. In either the confined or unconfined case, the material in regions 402 and 404 may be homogeneous or inhomogeneous such as an air/diode laser structure combination.

In general, many grating regions and associated waves may be superimposed in the partial view shown and either decoupled or cross-coupled with one another. In a simple case employed for illustrative purposes, two waves 408F and 410F originate in one region 402 and are coupled to one another by gratings 403 in that region, and one or both of these waves cross boundary 406 into region 404. This region, for the simple case, has no grating structure and is referred to as the preferential coupling region because one of the two wave components is preferentially coupled through an interface between the two regions 402 and 404 at boundary 406. From one point of view, it is boundary 406 between regions 402 and 404 that dictates, in a large part, how the waves propagate or extend across the boundary into preferential coupling region 404, if they do so at all.

Waves propagating through grating region 402 do so as two component waves 408F and 410F with associated wave vectors. As seen in FIG. 4, wave 408F intersects grating at an angle and is thereafter reflected, at least in part, as wave 410F. Then, wave 410F may be reflected again by a grating 403 and again reflected, at least in part, as the original component wave 408F. Thus, fundamentally, waves 408F and 410F are alternately coupled one into the other each time they intersect with a grating 403 or other such periodic perturbation. In view of the multiple distributed interactions between the waves, the coupling via the grating structure can be viewed as diffraction. Due to boundary 406 and its angular relationship with waves 408F and 410F, a substantial portion of one wave 408F is coupled into the other wave 410F so that a major volume of this other wave will be present in region 404. Since there is no perturbation present in region 404, no coupling back into direction 408F can take place. Thus, at boundary 406, a substantial amount, if not practically all, of the component waves 408F propagating in a first direction, represented by arrows 408F, have coupled into component waves 410F propagating in a second direction, represented by arrows 410F. Segregation of the waves thus occurs at boundary 406 with coupling of energy from one wave component 408F into the other of the two wave components, i.e., wave component 410F. Therefore, this invention involves the control over and coupling of wave components 408F and 410F at boundary 406 between grating region 402 and non-grating region 404 in medium 400 by manipulating the distribution of power between these two wave components 408F and 410F through the selection of the relative angle for boundary 406.

The angle of boundary 406 can be simply defined with respect to wave vectors 408F and 410F. In this example, as illustrated in FIG. 4, wave 410F is the wave vector primarily transmitted through boundary 406. This preferred wave vector 410F is referred to as $\vec{U}$. The second wave vector 408F is referred to as $\vec{V}$. In the partial view of FIG. 4, of a larger structure, boundary 406 between regions 402 and 404 has surface normal vector $\vec{S}$. Vectors $\vec{U}$, $\vec{V}$, $\vec{S}$ and are unit vectors. The preferred angle of boundary 406 is thus defined when $|\vec{V} \cdot \vec{S}| \cong 0$, i.e., when boundary 406 is substantially parallel to or approximate to wave vector 408F. In some applications, it may be desirable that $|\vec{V} \cdot \vec{S}|$ is a small number, not equal to zero, as the principal of operation of coupling light from wave vector into the preferred wave vector at boundary 406 will still efficiently occur and thus meeting the requirements of this invention. In addition, it may be that this condition is satisfied only along some portions of boundary 406 in the larger picture composed, in part, by the partial view shown in FIG. 4. According to the definition given above, it may be that $|\vec{V} \cdot \vec{S}| \cong 0$ in some cases in the prior art where the wave vectors are perpendicular, i.e., $|\vec{U} \cdot \vec{V}| = 0$, such as is the case with a 90° reflectors employed in a DFB or DBR laser source, for example, as shown in FIG. 7e of U.S. Pat. No. 5,337,328. FIG. 7e in U.S. Pat. No. 5,337,328 is one of many examples in the art of the use of 45° gratings for the sole purpose of turning the direction of light in an optical cavity by 90°. This invention, however, is in reference to those cases where $|\vec{U} \cdot \vec{V}| \neq 0$.

It should be noted that the optically reciprocal operation of coupled regions 402 and 404 is also possible, i.e., a single wave component 410 R, propagating in preferential coupling region 404 in a direction opposite to wave component 410F with be segregated at boundary 406 into two wave components 408R and 410R and continuously coupled, alternately one into the other, as the two components propagate through grating region 402 away from region 404, neither of which will cross back into region 404. As will be seen in the description below, the adaptation of regions 402 and 404 in a semiconductor laser source includes at least one optical cavity end reflector at a terminal end of region 404, opposite to boundary 406, and which is substantially perpendicular to the propagating direction of wave component 410F or 410R. Thus, a portion of component 410F is reflected back as component 410R to function as feedback for laser operation.

The foregoing explanation is a fundamental difference over the structures illustrated in U.S. Pat. No. 5,337,328. As a result, α-DFB laser sources, to be now discussed, that incorporate the design concept of FIG. 4 are greatly improved in efficiency of operation and their performance with a substantial improvement in coupling of generated light and power into one propagating wave near the laser facet output.

Reference is now made to FIG. 4A illustrating an angled distributed reflector optical device according to this invention comprising an α-DFB laser source 30 having an angled grating 35 for controlling the spatial and spectral qualities of the light emitted at both ends of the structure. In the example here, α-DFB laser source comprises an optical resonant cavity 32 (shown in shaded form which is also the pump stripe) with a mean optical axis 38' and consists of three parts: a diagonal grating region 33 that includes a pattern of diagonal grating pattern 35 that may extend outside diagonal grating region 33 (although not required to do so), and two light preferential coupling regions 34 where no grating pattern is present. Regions 34 are formed at opposite ends of diagonal grating region 33 between respective end facets 36 and 37 of α-DFB laser source 30. An angular boundary 31 is formed between preferential coupling regions 34 and diagonal grating region 33, which is formed at an angle with respect to end facets 36 and 37 as well as at an angle with respect to the orientation of grating grooves 35A.

The pump stripe for source 30 conforms to the configuration of optical cavity 32, and extends between facets 36 and 37 and, in this embodiment, includes preferential coupling regions 34. Therefore, numeral 32 for referencing the optical cavity is also used to reference the pump stripe as 32. Notably, preferential coupling regions 34 adjacent to these facets, in this embodiment, are shown wider in width than diagonal grating region 33. Grating pattern 35 is formed across the device between dotted lines 35B using techniques, as known in the art, to form the pattern. It should be noted that pattern 35 may extend into other regions of the chip, i.e., other than just stripe region 32, such as indicated at 30A and 30B. It is preferable that the grating does not extend into preferential coupling regions 34. However, the extension of the grating into regions 30A and 30B does not serve any purpose, other than being there for the convenience of grating pattern generation. Therefore, the gratings may either be patterned or not patterned in regions 30A and 30B.

The pump stripe 32 of α-DFB laser source 30 is generally formed as a gain guided region. However, this does not eliminate the possibility that an index guide can be formed as part of optical cavity 32. The waveguide properties of cavity 32 are attributed, therefore, to the established gain profile and the guiding by the gratings formed approximately between the optical cavity side regions 32A and 32B.

For purposes of clarity of the structural features present in α-DFB laser source 30, only the angled grating is shown in FIG. 4A, which is buried within the semiconductor structure of the laser as is well known in the art. Also, as well known in the art, these semiconductor laser structures may be comprised of double heterostructures with an active region comprising a single active layer, a single quantum well, or multiple quantum well (MQW) structure. A strained superlattice may be formed between the active region and its associated cladding and confinement layers. The typical combination of layers forming the semiconductor laser structure comprises Group III–V compound semiconductor layers, such as GaAs/AlGaAs on a GaAs substrate, InGaAsP/InP on a InP substrate, or InGaN/GaN or AlGaN/GaN on a sapphire or SiC substrate. However, other direct bandgap materials may be employed such as Group II–VI compound semiconductor layers.

Angled distributed reflector waveguide media of this invention, including the laser source as shown in FIG. 4A, may be of various types including, but not limited to, semiconductor lasers, laser arrays, semiconductor amplifiers, passive waveguide devices, MOPAs, or other light generating and light propagating waveguide devices. All such devices have a distributed grating that is in the diagonal grating region 33 in pump stripe 32, which may be a periodic or nearperiodic grating comprising a plurality of substantially parallel grooves 35A, or may be a dielectric stack, either of which is formed in the medium body. The grating pattern may also be formed at an air-semiconductor interface on the surface of the medium body. As explained in U.S. Pat. No. 5,337,328, grooves 35A are sufficiently separated in spatial period to permit the propagating waves to interact with the embedded grating grooves 35A which, in diagonal grating region 33, may be in a broad area pump stripe that is tens to hundreds of microns wide and several hundreds of microns long.

Mode analysis of laser cavity 32 indicates that there are two propagating neighboring, grating-confined modes in cavity 32 each traveling with two grating-coupled, quasi-plane wave components that propagate in two different directions throughout the diagonal grating region 33. These waves are illustrated, in part, in FIG. 5 as an angular or angled wave 39, propagating in a direction substantially parallel with boundary 31 at an acute angle with respect to facet 36, and a parallel wave 38 propagating in a direction perpendicular or normal with respect to the planar extent of end facet 36 (or parallel with mean optical axis 38'). These two waves of one grating-confined mode coexist with two similar waves of another grating-confined mode both of which propagate with substantially equally high gain compared to other cavity modes and are distributed nearly symmetrical about a position in K-space at which substantially perfect Bragg matching with grating 35 is achieved. The two grating-confined modes, which are nearly equally preferred, exist simultaneously and the superposition of their electric field vectors forms a beat pattern along cavity 32. The resulting spatially varying intensity distribution in optical cavity 32 corresponds to an exchange of power between the two pairs of degenerate waves of the two grating-confined modes. The difference in propagation constants for these two modes results in a periodic beating effect along diagonal grating region 33 of FIG. 4A resulting in an alternating local intensity maxima and minima with a periodic exchange of optical power between the wave components, i.e., when either propagating wave interacts with a groove 35A, its power is reflected and transferred into the other propagating wave, respectively. Thus, the associated power flow in diagonal grating region 33 alternates between a right-going and a left-going wave both of which are nearly Bragg-matched to grating grooves 35A so that grating 35 serves to couple power between these two waves 38 and 39 which are shown in detail in FIG. 5. We have examined the electroluminescence of fabricated α-DFB laser sources and observe periodic carrier depletion along diagonal grating region 33 which reveals the alternating beat pattern corresponding with the right-going and a left-going waves 38 and 39. The output from such α-DFB laser sources via the preferential coupling region forms a preferred mode which is a superposition of the two grating-confined modes.

Thus, it will be realized that the angled distributed reflector devices of this invention differ from angled distributed grating reflector devices of the past in the provision of preferential light coupling regions 34 near facets 36 and 37 of FIG. 4A having no gratings that may be slightly broadened in width compared to grating region 33. The angle, $\theta_2$, of boundary 31 (FIGS. 5 and 6) with respect to normal incidence (or the direction of normal propagating wave 38 or the direction Z) to either facet 36 (FIG. 5) or facet 37 (FIG. 6) is chosen to place boundary 31 substantially codirectional with the angled propagating wave 39. As illustrated in FIG. 5, angled propagating wave 39 will not cross boundary 31, since it is substantially parallel to boundary 31, but rather will be couple into parallel propagating wave 38, and thereafter cross boundary 31 into preferential coupling region 34 and exit via laser facet 36. Once the light coupled into parallel wave 38 crosses boundary 31, it has no opportunity to couple back into angled wave 39 since there are no gratings in preferential coupling region 34. The output facet of laser source 30", which may be either facet 36 or facet 37, is partially reflecting so that fraction of parallel propagating wave 38 in region 34 will be internally reflected at the output facet as feedback into optical cavity 32 for stabilized laser operation. In such a case, the other facet will be highly reflecting so that nearly all of the light is reflected back into laser source 30". Angle, $\theta_2$, is approximated in that it is optimized for coupling light in the direction of parallel propagating waves 38. Also, the portion of the pump stripe 32 in preferential coupling region 34 is wider, as shown at "B" in FIG. 5 than compared to the width of the pump stripe in diagonal grating region 33, as shown at "A" in FIG. 5. This broadened pump stripe in region 34 permits transmission to facet 36 through a non-lossy pumped region 34 of all forward propagating light of parallel propagating waves 38 that cross boundary 31. Also, by moving out the side 34A of the pumping stripe in region 34, either angularly as shown at 34B or spatially as shown 34C, the guiding effect of wall 34A inhibited from creating filaments that interfere with the cavity modes. Similarly, the boundary 34A of preferential coupling region 34 may be positioned at 34B or 34C to further reduce filamentation in providing a path for forward-going light to reach facet 36.

As another point of distinction of this invention over the prior angled grating devices, the angled Bragg grating reflector device illustrated in FIG. 2 has an angled grating 14A disposed at an angle $\theta_1$ with respect to the facet normal and light within the grating propagates at approximately angles of 0° and $2\theta_1$ with respect to the facet normal. However, in this invention, with particular reference to FIG. 6, preferential coupling region 34 is positioned near the facets that maximizes coupling into the $2\theta_1$ direction near the facets. The boundary 31 of region 34, at the interface with diagonal grating region 33, where it intersects the light path, is angled with respect to both the mean optical axis (Z direction) of optical cavity 32 and grating grooves 35A. The angle of boundary 31, $\theta_2$, as measured from normal incidence of facet 37, which is approximately parallel to normal propagating waves 38, is chosen so as to maximize the opportunity for light traveling at angle $2\theta_1$ to be diffracted to angle 0° near boundary 31 while minimizing the opportunity for light traveling at angle 0° to be diffracted at angle $2\theta_1$, as illustrated in FIG. 6. Thus, the angle, $\theta_1$, of grooves 35A with respect to normal incidence of facet 37 is chosen to approximate the angle of propagation of the undesired, non-normal propagating waves 39, i.e., $2\theta_1$ with respect to the facet normal. This is approximate because the Bragg grating condition is approximate as previously discussed in the Background. However, it is to be noted that it is not necessary that boundary 31 be even approximate to $2\theta_1$ and improved performance in light output coupling will generally be achieved if the angle $\theta_2$ is chosen to lie between $\theta_1$ and 90°. For example, in order to modify the size of optical beam exiting from angular or diagonal grating region 33, deviation from the preferred angle, $2\theta_1$, is accomplished to change beam size. Also, multiple, superimposed gratings or large prism refraction may be incorporated into diagonal grating region 33 and the angle of boundary 31 may be accordingly adjusted within the 90° range to accommodate these structural changes formed in optical cavity 32.

It should be noted that, in FIG. 6, boundary 31 need not be strictly linear or planar, but may deviate from strict linearity in order to diminish the build-up of amplified light along the interface. For example, boundary 31 may have a stepped line, concave or convex shaped, or sinusoidal appearance.

In summary of the main feature of this invention thus far described, it is known from a study of known α-DFB lasers, such as those disclosed in U.S. Pat. No. 5,337,328, that a large portion of the cavity mode power is lost at each facet due either to reflection of light back into the semiconductor laser in such a way that the light is not coupled back into the preferred cavity mode, or due to transmission of light through the facet at an angle that does not contribute to useful output power. This is because the propagating light is divided between two propagating waves established at each grating groove where one of the waves 38 will reflect and propagate in a direction approximately normal to the facet and the other waves 39 will reflect and propagate at an angle with respect to the facet normal. The latter angled wave, therefore, has a portion which exits via the facet at a wide angle from the facet normal or a portion that reflects at an angle back into the laser structure.

Also, these two waves, when propagating down the optical cavity, are nearly Bragg matched to the grating so that they will continuously couple from one wave to the other as they interact with each grating groove. Thus, at any given time, there will be a portion of the propagating light at a laser facet that is in the non-normal, lossy wave which is not utilized. The α-DFB gain medium of this invention provides for the formation of a preferential coupling region 34 adjacent to the optical cavity ends that eliminates coupling of light into the non-normal, lossy wave 39 near the cavity ends so that light incident on the facet is all in the preferred direction normal to the facet, i.e., the normal wave direction, so that the shape of region 34 is created so as to promote coupling of only the parallel wave 38 at boundary 31. Both regions 33 and 34 are pumped, and coupling region 34 can be slightly broadened or flared toward the facet to prevent deviation along the non-grating waveguide edges of the normal wave from its propagation direction other than normal to the facet and to transmit all of the forward propagating light crossing boundary 31 to the cavity end or facet. The angle of boundary 31 is chosen to be substantially collinear with the non-normal, lossy wave propagation direction. As a result, only the parallel mode propagating light will cross over the interface at boundary 31 and will not further experience any conversion or coupling into the non-normal or angled, lossy wave because there is no further possible interaction with grating grooves 35A since these gratings are absent from regions 34.

The concepts described herein in the form of a laser source shown in FIG. 4A have been reduced to practice. As to performance of α-DFB devices in the form of such laser sources, several α-DFB laser sources of the standard design, i.e., with an angled grating distributed reflector extending the full optical cavity to the facet ends, and of the new design of this invention (modified design), i.e., having preferential coupling regions 34, as shown in FIGS. 4A and 5, were fabricated simultaneously from the same GaAs wafer stock and their operational aspects compared. The pump stripe width, grating pattern angle, cavity length and mirror coatings (back HR facet coated and front AR facet coated to provide a light beam output) were equivalent for the separate devices. A histogram of complied measurements is shown in FIG. 11. Analysis of device performance of the α-DFB laser sources of the new design of this invention, shown at curve 56, statistically had about a 50% higher average efficiency than the α-DFB laser sources of the standard design, shown at curve 54. The standard deviation in efficiency of the α-DFB laser sources of the new design of this invention is also roughly half of that observed for the α-DFB laser sources of the standard design. Also, in general, the α-DFB laser sources of the modified design of this invention consistently operated to greater than 1 W peak output power with smooth linear LI characteristics while the α-DFB laser sources of the standard design were limited to peak powers less than 1 W and typically exhibited LI characteristics with one or more curve kinks. Also, observation of the electroluminescence pattern of the α-DFB laser sources of the modified design demonstrated a significant absence in the magnitude of power in the non-normal, lossy wave at the device facets.

It should be noted that preferential coupling regions 34 are pumped in order to maintain the gain of the forward propagating parallel mode. Pumping of this section can be reduced, as will be explained later, or can possibly be eliminated without the introduction of too much loss due to absorption since the extent of region 34 in the Z direction is small. Pumping can be accomplished via a stripe pattern or other geometry pattern formed on regions 34. However, some pumping of the region is generally desirable.

It should be noted that it is not necessary to restrict the utilization of a optical device to a double-pass configuration, such as shown for α-DFB laser source 30 in FIGS. 4A and 5. As shown in FIG. 7, source 30' functions as a single-pass angled grating filter that may be utilized in an optical amplifier, ring laser or function as a spatial filter on an optical beam which is provided as input at facet 37, which may be AR coated, for an external light beam to source 30'. In this single-pass embodiment, also, output facet 36 would also be AR coated.

While optical device 30" of FIG. 4A has been discussed in providing an output via parallel wave 38, in FIG. 8, light enters and exits the grating region at two different locations with the respective boundaries 31 aligned according to an angle that is receptive of the desired wave output. As best shown in FIG. 5, optical device 30" utilizes angled wave 39, instead of parallel wave 38, at one end of the medium such that parallel wave 38 propagates relative mean optical axis 38' and thence, at boundary 31A, light in parallel wave 38 is coupled into angled wave 39 at boundary 31A and propagates relative to a second mean optical axis 39' and is coupled into preferential coupling region 34A. Thus, angled wave 39 propagates substantially parallel with boundary 31 so that coupling of angled wave 39 into parallel wave 38 at boundary 31A, which is preferential to angled wave 39, provides an output via angular facet 36A or directional coupling to another integrated stage included with laser source 30".

With improvement in light coupling efficiency in the spatial and spectral single mode α-DFB source through the use of preferential coupling regions 34, we have also conducted an investigation relative to the wavelength tuning capabilities of these sources and their dependence upon changes in ambient temperature, i.e., the temperature of the source underlying heatsink, and as a function of their drive current. The utilization of tuning stability known to those angled grating reflector waveguide devices of the prior art is equally applicable for sources of this invention, although there was no appreciation in the prior art of the following: The shift in the single mode output lasing wavelength of an α-DFB laser source was measured as a function of ambient temperature at various fixed operating currents as well as a function of operating current at a fixed heatsink temperature. Measurements, were performed via a high resolution (0.01 Å) wavemeter. The results of these measurements are shown in FIGS. 9 and 10. As shown in FIG. 9, at operating currents of 2.0 A and 2.7 A, single wavelength tuning can be accomplished over a 20° C. temperature range, having a tuning slope of 0.076 nm/° C. By control of the heatsink temperature, therefore, a selectable frequency can be realized. The linearly of such control for the α-DFB laser sources is better than can be achieved with conventional stripe lasers.

Also, as shown in FIG. 10, continuous single wavelength tuning was observed from laser threshold to a 4A operating current at a maintained heatsink temperature of 20° C. due to rise in the temperature at the laser junction. The diffraction-limited output power of the α-DFB laser source at 2.7 A is approximately 1 W CW. Therefore, the α-DFB laser source of this invention incorporating preferential coupling regions, as well as α-DFB laser sources without such regions, are highly suitable as a high power tunable laser source with maintainable spectral and spatial beam properties compared to conventional DFB and DBR lasers.

For use with a nonlinear crystal, such as a periodic polled $LiNbO_3$ waveguide 204, shown in FIG. 20, a frequency mixing system, such as for frequency doubling, is shown comprising an α-DFB laser source 200. Source 200 comprises an angular pump stripe 201 with preferential coupling regions 203. The output beam from the front AR coated facet is coupled via conventional lens system 202 into nonlinear SHG crystal device 204 that has a waveguide 206 comprising periodic domain inverted channel that provides for quasi-phase matching (QPM) for second harmonic generation, i.e., to generate a fractional harmonic wavelength of output wavelength of α-DFB laser source 200. Alternatively, waveguide 206 is not necessary; rather, the crystal bulk may be employed itself with the periodic domain inversion extending laterally as well as transversely through the crystal bulk. Such crystals, as is well known in the art, may be $LiNbO_3$, $LiTaO_3$ or KTP. Thus, source 200 may be fabricated in InP to produce a red or near-red spectrum output which is converted by QPM device 204 into a wavelength output beam in the blue or green light spectrum. What makes an α-DFB laser source important for this application is its high spatial selectivity (transverse single mode maintenance) and spectral selectivity (continuous wavelength maintenance) for device 200 that requires these features for optimum performance. Conventional semiconductor laser devices, particularly DFB and DBR devices, such as illustrated in U.S. Pat. Nos. 5,247,528 and 5,644,584 cannot provide such spatial and spectral performance to power levels comparable with that of the α-DFB laser.

The α-DFB laser source is highly useful for any applications that require a narrow linewidth, single wavelength output, such as spectroscopic applications, because of its high quality single spatial and spectral mode operation. Moreover, single emitter α-DFB laser and α-DFB laser arrays with continuous wavelength tuning are desirable pump lasers for fiber amplifiers and fiber lasers that require wavelength matching to specific absorption bands of the active material utilized in such devices. As such, changes in operational frequency of the α-DFB laser pump source due to spurious feedback from the application is ineffective in changing the wavelength established by the grating, which is a present-day problem, particularly for optical amplifier pumps. Additionally, the temperature dependent temperature dependent wavelength tuning rate, as exemplified above is about five times less than that observed in conventional multimode pump lasers and laser arrays. Therefore, the output wavelength of the α-DFB laser is definable by the grating period and grating angle in the laser and is continuously tunable over a significant wavelength range, yet temperature insensitive to a point where the laser source will not significantly detune from the desired wavelength of operation within small laser package temperature changes.

As indicated in FIGS. 9 and 10, the output wavelength of the α-DFB laser source can be stabilized relative to temperature and tuned as well by control of its ambient temperature. However, other means can be utilized to select and tune the α-DFB laser where the grating angle and period already, from the beginning, define an output wavelength that may not be exactly as desired. The α-DFB laser source 60 in FIG. 12 provides for such tuning. Source 60 is basically the same as source 30" shown in FIG. 4A except for waveguide index step regions 68 formed within preferential coupling regions 64 to function as planar waveguide refracting prisms and, also, the gratings in grating region 63 do not extend into unpumped regions. Source 60 in FIG. 12 comprises and optical cavity 62 between end facets 66 and 67 comprising angled grating region 63 comprised of a periodic array of angularly disposed grooves formed at an angle φ, with respect to the facet normal, and end preferential coupling regions comprising regions 64 with no such gratings is separated from the grating region 63 by angularly disposed boundary 61. Grating cavity region 63 has a defined cavity width between side regions 63A and 63B. Index step regions 68 can be created by forming an index difference in the material within regions 64, such as by embedding materials or etching materials, or more preferably by current injection. In this latter case, preferential coupling regions are not fully part of the pump stripe, i.e., the pumping of laser source is achieved through pumping of only grating region 63 and a portion of regions 64 comprising encompassed regions 68 as illustrated in FIG. 12 by the speckle pump pattern. Thus, a pump pattern 68 is formed, for example, having a right-angle triangular shape where the angle of side 69 as well as the amount of index change at this side wall determines the direction of internally refracted light from facets 66 and 67, i.e., the angle of the light entering grating region 63 via boundary 61 is a function of the angle, γ, of side wall 69 and the difference in refractive index between regions 68 and the remaining portions of preferential coupling region 64. Thus, light reflecting at normal incidence off of facets 66 and 67 will be slightly refracted by formed prism region 68 (angle=f(γΔn)) and thus, the angle of the reflected beam back into grating regions 63 can be slightly changed, leading to wavelength selection with current injection changes applied to pattern regions 68 in preferential coupling regions 64. Current injection in regions 68 may be, for example, around 300 $A/cm^2$.

As indicated in FIG. 12, a portion of preferential coupling regions 64 will not be pumped (region 64 minus region 68). The unpumped portions may be lossy to the propagating light, particularly if the region between side wall 69 and boundary 61 is fairly large. If it is desirable suppress this loss for more efficient operation, the contacting of preferential regions can be such that regions 68 and the previously unpumped portions of preferential coupling regions 64 are differentially pumped such that, for example, regions 68 are pumped with higher current injection while the regions surrounding regions 68 (the remaining portion of preferential coupling regions 64) is pumped at lower current injection that is sufficient to maintain transparency to the propagating light in these coupling regions.

As indicated above, this same tuning can be accomplished by changing the refractive index in regions 68 through a material change to the region such as employing an etch and regrowth process or impurity induced disordering. In the case of such an effective index change through a material change, the entire preferential coupling regions 64 may be pumped along with grating region 63.

It should be noted that with respect to angle, γ, the larger the angles, the less the amount of refractive index step, Δn, is required for an equivalent angular deviation of the beam. It should also be noted that the preferable angle for boundary 61 is also a function of the design of this tuning prism.

It should be noted that the tuning prisms 68 can also be employed to counteract changes in the wavelength of operation due to temperature change in the laser source to maintain the desired wavelength of operation. For example, if the operational temperature of laser source 60 should increase and change the peak wavelength operation by one or nanometers, a controller attached with contact matching regions 68 can be employed to monitor the source temperature and change the applied current or bias to regions 68 to correct and return the output wavelength to the desired wavelength of operation.

Alternatively, rather than current inject regions 68, these regions can be covered with thermal resistance heat strip formed to the triangular pattern of regions 68 where applied heat causes a change in refractive index of the regions.

It should be further understood that the pattern 68 can be changed relative to angle γ relative to a photoresist pattern via photolithography and masking techniques to form laser arrays or bars having a plurality of α-DFB laser emitters all having the same fixed grating and period but, with different reflected light diffraction qualities via different angle γ sides 69, will provide a plurality of laser emitters having at different wavelengths. The control of their respective current injection provides the further capability of tuning the respective emitter wavelengths. This embodiment would have application to dense wavelength division multiplexing (DWDM) applications for multi-wavelength transmission.

Thus, dynamic wavelength adjustment can be achieved in the invention by adjusting the refractive index in refracting prism regions 8 utilizing thermal or current injection phenomena or a combination of both in preferential coupling regions 64.

Alternatively, prism shaped regions 68 may be comprised of buried thin Fresnel phase plate regions. Other beam refracting techniques may be employed, such as periodic electrodes. Such periodic electrodes may be formed in coupling regions 64 as stripes or other geometric shapes through which current injection is applied, or a surface acoustic wave may be employed to refract the reflected propagating light.

With the introduction of the preferential coupling regions as a primary feature of this invention, a higher gain path for parasitic grating-coupled modes is introduced which reduces the magnitude of output power that can be reached before these parasitic modes reach threshold, i.e., the parasitic grating-coupled modes, once lasing, operate to take some optical power that could be utilized with the major α-DFB mode. A grating-coupled mode is one that is coupled between the facets via the inner edges of the pump stripe. This mode competition effect can be suppressed, in one way, by the geometry change for the preferential coupling regions shown in FIG. 13. In FIG. 13, the optical device comprises α-DFB laser source 70 having an optical cavity 72 that includes angular grating regions 73 and a portion 74A of preferential coupling regions 74, which interface with angular grating region 73 at angular boundaries 71, the angle of which is chosen in a manner as explained. Portions 74B are not pumped and lie outside injection stripe 72. Light propagating in portion 74B is absorbed before reaching the facets 76 and 77. As a result, loss added to the parasitic modes is increased so that these modes require higher threshold currents. Therefore, the overall device efficiency may be also slightly lowered, but no current is wasted in pumping portion 74B that could, in the case of their pumping, be supplying carriers to a parasitic grating-coupled mode. This factor, therefore, is believed to offset the drop in any overall device efficiency due to the lack of pumping portions 74A.

Also, in this configuration, the angularity of stripe 72 has to be such that there is a sufficient offset 78 so that there is no direct path between facets along the facet normal in which there is generation and support for Fabry-Perot modes between end facets 76 and 77. The advantage of this embodiment is, therefore, the reduction of deleterious effects that may arise in the case where preferential coupling regions 74 are flared having a side wall portion at 79 (which is 34A in the embodiment of FIG. 4A) thereby including portion 74B as part of preferential coupling regions 74, which reduces the possible amount of single wavelength, single lateral mode output power but suppresses the operation of parasitic modes. The embodiment of FIG. 13 in some configuration can provide as much as 2 times greater single wavelength, single mode power than possible with laser source 30" shown in FIG. 4A. However, in longer cavities in which offset 78 is larger, the threshold for parasitic grating-coupled modes is high and the modifications of FIG. 13, therefore, may not be necessary.

Another manner of suppressing the introduction of parasitic grating-coupled modes is the introduction of a taper or flare in the stripe geometry of the laser source, which is illustrated in the laser source 210 shown in FIG. 21. The current or pump stripe taper 212 continues into the preferential coupling regions 215 and 216 (whether co-pumped with the grating region or not), providing a clear widening path for facet-directed light to reach the laser source facet. The preferential coupling regions may have a flared shape to permit light to reach the facet, as illustrated in FIG. 21, or have a shape as illustrated in FIG. 13 that suppresses parasitic grating-coupled modes. At higher current levels, as previously described, oscillation along the cavity can result in generation of parasitic grating-coupled modes with different spectral and spatial mode characteristics compared to the spectral and spatial mode characteristics of the α-DFB mode. However, the parasitic grating-coupled modes are forced to take a longer propagation path with more loss incurred due to the larger offset 230 introduced with the taper stripe geometry. As a result, the α-DFB mode is enhanced with gain that would have been otherwise loss to the parasitic mode.

The use of tapered stripe geometry is known in the art as illustrated, for example, in U.S. Pat. No. 5,392,308. This taper geometry, however, is employed in combination with the present invention for a purpose of suppressing parasitic grating-coupled modes. In FIG. 21, the tapered stripe geometry at 211 of α-DFB laser source 210 is utilized in a region 212 that includes the periodic gratings, e.g., gratings 219. Moreover, the tapered geometry is utilized in optically coupled preferential coupling regions 215 and 216. Thus, the tapered stripe geometry extends from rear facet 222 to front facet 220. However, it should be noted that the taper need only extend along a portion of the cavity, such as, for example, from a point 221 to output facet 220.

To be noted is that the periodic grating 219 may extend into unpumped regions 217 and 218 of source 210, as previously indicated in previous embodiments, but is absent from or modified in preferential coupling regions 215 and 216. Thus, pumping of tapered stripe geometry includes preferential coupling regions 215 and 216 and tapered grating region 212. Also, to be noted is that, due to the taper geometry, preferential coupling region 216 and the width of the pumping stripe near region 214 is larger in area than preferential coupling region 215 and the width of the pump stripe near region 213 so that enhancement to the gain is provided to the mode coupled into region 216 with reduced spatial hole burning by way of allowing the mode to expand laterally toward the output facet and supply additional carriers. At output facet 220, the taper is at its widest extent in the stripe geometry, and the taper can extend the full length between facets 220 and 222. Since more gain can be applied to the propagating mode in the wider regions of the tapered stripe 211, output power is enhanced while maintaining single mode beam quality and good device efficiency. The taper geometry 211 permits the α-DFB mode to expand and spread as it propagates to facet output 220 while maintaining single transverse mode operation. The expanded optical cavity at 214 and 216 toward the output end of the laser source allows for more carriers to be supplied to the amplified and preferred α-DFB mode. The output aperture at facet 220 of laser source 210 may be much wider than in the case of a straight pump stripe geometry with similar cavity length and angle. As a result, as previously indicated, there will be less spatial hole-burning at high power levels in the wider front portions of the cavity and the far field pattern of the output beam from facet 220 will have narrower lateral far field divergence. Relative to parasitic grating-coupled modes, taper geometry 211 provides the ability to suppress the operation of these modes by forcing these modes to propagate along a longer and lossier path than the paths of propagation taken by these modes in a comparable straight cavity configuration.

In FIG. 21, the taper geometry 211 is shown with pump stripe edges, one of which is predominantly parallel to the grating grooves and the other of which is angled with respect to the grating grooves. This is an arbitrary selection for the relative orientation of the pump stripe edges and, in fact, both may be angled with respect to the grating grooves. In a similar manner, the edges of the pump stripe of a straight cavity α-DFB are generally parallel to one another, but may also be either parallel to the grating grooves 219 or tilted or at an angle with respect to the grating grooves 219.

The taper cavity design is a form of patterned pumping used to selectively supply more carriers in the regions of the device where the propagating mode intensity is greater. In addition, narrow portion 213 of the pump stripe acts as a filter region which incurs higher losses to modes other than the mode of interest, such as the fundamental mode. This function is similar in nature to a narrow waveguide section monolithically coupled to a flared amplifier section forming an unstable resonator, which narrow waveguide serves as a filter for the preferred cavity mode. Other forms of patterned pumping are conceivable to accomplish more efficient operation, such as periodically pumping or pattern pumping in intervals along or across the cavity, such as illustrated, in part, in patent in U.S. patent (Ser. No. 08/650,704, filed May 20, 1996), or by shaping the pump stripe to follow a S-shaped path of the propagating mode, such as depicted in U.S. Pat. No. 5,337,328 of Lang et al.

The use of tapered stripe geometry has been reduced to practice as shown in FIG. 21. Several α-DFB cavity lasers having 2,000 μm cavity lengths were fabricated with this geometry having broad area tapered stripe geometry extending from 100 μm to 250 μm. These devices demonstrated single frequency, single spatial mode output power greater than 1 W. Good laser performance was observed to over 1.5 W output power with thresholds and slope efficiencies comparable with α-DFB lasers with straight stripe geometry with 2,000 μm cavity lengths. The tapered cavity output power is about a 50% higher than the straight stripe geometry α-DFB lasers with preferential coupling regions. Also, the tapered cavity has a narrower lateral beam divergence that is accompanied with maintained single linewidth, spatial beam quality.

If any Fabry-Perot modes persist in the formation of α-DFB laser sources as disclosed herein, as well as in the prior art, lossy regions can be formed outside the main pump stripe in order to suppress such straight path modes. Such Fabry-Perot modes are suppressed by incorporation of cavity spoilers into regions of the optical device outside of the pumping stripe as illustrated in the embodiments of FIGS. 15–17 to enhance loss outside the stripe region. These embodiments illustrate the α-DFB laser source of this invention, such as, for example source 30' in FIG. 4A, but are equally applicable to α-DFB laser sources of the prior art. In FIG. 15, Fabry-Perot angular spoilers 92 are formed in the regions outside pump stripe 32 by forming a region comprising a negative index step stripe formed by deep implanted or diffused dopants such as accomplished by impurity induced disordering, by ion implants, by etched regions or by embedded reflectors formed in the waveguide layers during wafer growth.

Any potential waves following along path 94 normal to facet 36 not absorbed within the unpumped regions of source 90 will encounter a spoiler 92 resulting in total internal reflection and propagation along path 96 where it may be internally reflected again via facet 37 and eventually absorbed in the structure. Alternatively, this Fabry-Perot spoiler may provide enhanced absorption in the region it is placed, which need not be a stripe but could also be a large portion of the unpumped region.

In FIG. 16, α-DFB laser source 100 contain spoilers 102 arranged substantially in arrays adjacent in an alignment along adjacent sides of pump stripe 32 preventing any straight-through paths for Fabry-Perot modes while not interfering with the function of pump stripe 32. Light reflected back into the cavity normal to facets 36 and 37 and escaping angular grating region 33 will be deflected by spoilers 102 due to their negative index step with the light deflected away from the optical cavity as illustrated in FIG. 16 at 104. The spacing of spoilers 102 may be fairly large such as tens of microns, e.g., 10 μm to 30 μm spacing.

The spoiler embodiment of FIG. 17 is similar to that shown in FIG. 16, except that Fabry-Perot mode spoilers 112 are curved to provide extra deflection by providing multiple deflected beams from an incident beam.

All previous examples of the feature of this invention relating to a preferential coupling region have been a region containing no gratings and also referred to as a nongrating region. But, as mentioned previously, the mechanism comprising this invention takes the form of a boundary between a region containing the angular reflector, e.g., a grating region, and a region that is characterized by having no gratings within its boundary, or a reflector or grating of a different character from the angular reflector. Reference is now made to FIG. 22 which is an example of the case of preferential coupling regions having a grating of a different character from the angular reflector. The α-DFB laser source 220 of FIG. 22 is similar to the α-DFB laser source 30" in FIG. 4A except that it includes, in addition, gratings 222 and 224 within preferential coupling regions 34 and amplifier region 226. Thus, numerical identification of like components of source 30" in FIGS. 4A and 5 are not repeated here and is incorporated here by reference. Preferential coupling region 34A adjacent to rear facet 36 may include a plurality of grating grooves 222 substantially parallel with the plane of facet 36 that are designed to provided high level of reflection of the α-DFB laser mode 38 (FIG. 5) so that most of the light, such as 98%, is return back into optical cavity 32. Alternatively, these grooves near back facet 36 may be omitted and facet 36 may be HR coated to function as a high reflector for propagating light. On the other hand, preferential coupling region 34B includes a plurality of grating grooves 224, substantially parallel with end facets 36 and 37, and are only partially reflective of the α-DFB laser mode 38 so that most of the light of this mode is transmissive of grating 224 and proceeds through waveguide region 226 to output at facet 37. Facet 37 is, thus, AR coated. Region 226 may be contacted with stripe 32 to be pumped together as one stripe or may be contacted separately and pumped with a different current or bias, CW or pulsed. In any case, region 226 functions as an amplifier to enhance the power of the light propagating to output facet 37. Therefore, this is an example where gratings of a different kind may exist in preferential coupling regions 34 but not interfere with their ability to couple out of the angled distributed reflector region 33 the preferred mode. Also, the configuration shown in FIG. 22 may be referred to as a master oscillator power amplifier (MOPA) capable of providing high power in terms of several watts in single wavelength, single spatial and spectral mode.

As mentioned above, the mode of conventional α-DFB laser sources of this invention with uniform gratings comprises a pair of neighboring, grating-confined modes with equally high gain that form a local maxima in view of the fact that gain is based as a function of mode numbers. In general, these two modes exist in equality in α-DFB laser cavities unless some asymmetry is introduced in the cavity causing preference of one mode over the other. Since an α-DFB laser contains a distributed reflector, the expectation is that the mode intensity would be maximum at the center of the optical cavity of the laser source under conditions of perfect symmetry. But, as previously indicated the two propagating modes have intensity maxima away from the center of the cavity, each mode with its maximum on opposite sides from the cavity center. The uniform distribution of these maxima along the longitudinal direction in the α-DFB laser source indicates that the two modes propagating in the α-DFB laser source beat with one another in a stable manner as a result of the availability of spatially distributed carriers. By introducing a phase shift, as shown in FIG. 18, or by introducing a refractive index step, as shown in FIG. 19, at the center of the α-DFB laser source or such a mechanism which is evenly distributed about the center, the mode structure of the optical cavity is changed so that there is a single mode with highest gain permitted in the optical cavity. This mode has an intensity distribution that is approximately symmetric about the center of the laser cavity. With the absence of a competing mode, the laser operation will become even more stable. Consequently, single mode permitted within the α-DFB laser cavity will have highest gain. This mode will consist primarily of a pair of waves propagating close to the Bragg angle ($\pm\theta_B$) with respect to the grating that exchange power symmetrically about the center of the pump stripe. The propagating mode will have an intensity distribution that is approximately symmetric about the center of the laser stripe having little or no periodic behavior along the stripe. The efficiency of the α-DFB laser source is improved with this central cavity mechanism since the preferred mode is centered in the stripe and has maximum or overall highest gain and lowest propagation loss. For example, the mode will extend less into the lossy unpumped region and, therefore, absorption losses will be reduced.

As shown in FIG. 18, α-DFB laser source 120 comprises a pump stripe 122 comprising angular grating region 123 having a periodic grating structure 125 with cavity end portions comprising preferential coupling regions 124 having no continuity of the grating structure and interfaced with grating region 123 at boundary 121. Periodic grating structure 125 has a uniform period except at its center at 127 where a phase shift in the grating period occurs. Grating shift 127 is located in grating 127 along or about the center of the α-DFB laser stripe 123, as opposed to at or about the center of the laser optical cavity, which leads to a restructuring of the two propagating waves within the optical-cavity of the α-DFB laser source. As a result, a single mode 128 in the optical cavity has highest cavity gain consisting primarily of two propagating waves exchanging power symmetrically about the center of the stripe, i.e., about phase shift stripe 127. The phase shift is preferably a one quarter shifted grating at 127, but because the grating wave vector is not collinear with the mode wave-vector, the required optimal phase shift required in the grating may differ from being precisely a quarter period. Because the preferred mode in phase-shifted α-DFB laser source 120 consists of a near equal mixture of coupled wave propagating at approximately $\pm\theta^B$ along stripe 122, power of both waves will be present near boundaries 121. Consequently, a phase shifted device can achieve improved efficiency if the phase shift is implemented in conjunction with preferential coupling regions of this invention.

The phase shift in grating 125 can be accomplished by conventional means such as the use of e-beam or phase mask exposure as is known in the art. With the use of a phase mask, the mask is prepared, for example, with a central one-quarter shifted grating. A double one-eight wave shifted structure may also be utilized. Moreover, multiple phase shifts may be employed instead of a single grating shift 127. These phase shifts need not be parallel to the stripe 122 or centered in the optical cavity. Also, it should be noted that the phase shift embodiment of FIG. 18, as well as the embodiment shown in FIG. 19, can also include the taper geometry illustrated in FIG. 21 to provide for suppression of parasitic grating-coupled modes.

In FIG. 19, α-DFB laser source 130 comprises pump stripe 132 comprising angular gratings 135 in angular region 133 preferential coupling regions 134 containing no gratings and interfacing with grating region 133 at boundaries 131. In the center of grating region 133, an index step 137 is provided to advance the phase, through the product of the index step and the width of the stripe, in either of the propagating modes with respect to gratings 135.

The resultant effect is the same as in the case of FIG. 18 in that the mode structure of the formed optical cavity is changed so that there is a single mode 138 with gain permitted in the cavity. This step can be made by etching material in region 137, by effectively blocking grating formation in this area, by doping this area, by overgrowing material in this area, or any means by which an index step can be introduced without disrupting the other functions of the laser structure.

It should be noted that the phase shift 127 in FIG. 18 and the index step 137 in FIG. 19 need not be in the center of the waveguide but rather may offset from the center to change the far field profile of the beam or may be multiple and distributed throughout the width of the grating region of the laser optical cavity.

Any of the foregoing embodiments may be formed as a laser array, forming a α-DFB laser bar 80 as shown in FIG. 14. Laser bar 80 comprises a plurality of angularly disposed pump stripe regions 82 between end facets 86 and 87 comprising grating regions 83 with angularly disposed gratings 85 and end preferential coupling regions 84, each forming an angular boundary 81 with grating region 83. The attributes of FIGS. 12 and 13 may be incorporated into the embodiment of FIG. 14, as previously indicated.

Although the invention has been described in conjunction with one or more preferred embodiments, it will be apparent to those skilled in the art that other alternatives, variations and modifications will be apparent in light of the foregoing description as being within the spirit and scope of the invention. For example, although the preceding embodiments have been illustrated for waveguide media in which the gratings are formed as part of a planar waveguide structure, the invention may also be realized in bulk optics devices or realized from physically separated devices. Further, although the preceding embodiments have been illustrated for waveguide media in which the use of the angled boundary between the angled grating region and the preferential coupling region is demonstrated at the input and output ends of the structure, the angled boundary may also separate different plural grating and non-grating regions within the optical device. Thus, the invention described herein is intended to embrace all such alternatives, variations and modifications that may fall within the spirit and scope of the following claims.

What is claimed is:

1. A optical device comprising:
   an optical waveguide having a mean optical axis defining an optical cavity for substantially confined light propagation;
   a periodic perturbation region provided in at least a portion of said optical cavity causing light to propagate along said optical cavity in two coupled waves incident along said region, a first incident propagating wave substantially parallel with respect to said mean optical axis and a second incident propagating wave at an angle with respect to said mean optical axis;
   the improvement comprising at least one preferential coupling region in said optical cavity, said preferential coupling region forming a boundary with said periodic perturbation region, an angle of said boundary relative to said mean optical axis chosen to be collinear with a propagation direction of said second incident propagating wave so that propagating light in said second incident propagating wave will substantially enter said preferential coupling region from said periodic perturbation region via said boundary in a propagation direction substantially parallel with said mean optical axis.

2. The optical device of claim 1 wherein said periodic perturbation region comprises a grating angularly disposed in said optical cavity.

3. The optical device of claim 1 wherein said optical waveguide has a taper extending along at least a portion of its length.

4. The optical device of claim 1 wherein said preferential coupling region is light diverging region.

5. The optical device of claim 1 wherein said preferential coupling region does not contain said periodic perturbation.

6. The optical device of claim 1 wherein said preferential coupling region is not pumped.

7. The optical device of claim 1 wherein means for tuning the wavelength of operation of the medium are formed in said optical cavity.

8. The optical device of claim 7 wherein said tuning means is formed in said preferential coupling region.

9. The optical device of claim 8 wherein said tuning means comprises index step regions formed in said preferential coupling region.

10. The optical device of claim 1 further comprising a phase shift formed in said periodic perturbation region.

11. The optical device of claim of claim 10 wherein said phase shift is a phase shift in a grating period in an angular grating comprising said periodic perturbation region.

12. The optical device of claim of claim 10 wherein said phase shift approximates one-quarter phase shift.

13. The optical device of claim of claim 10 wherein said phase shift is a refractive index step.

14. The optical device of claim of claim 13 wherein said phase shift approximates one-quarter phase shift.

15. The optical device of claim 1 further comprising spoilers formed in regions adjacent to said optical waveguide.

16. The optical device of claim 1 further comprising means for pumping only a portion of said preferential coupling region.

17. The optical device of claim 16 wherein said pumped portion comprises a prism-shaped region for varying the operational wavelength of the optical device.

18. The optical device of claim 1 wherein said preferential coupling region includes means for wavelength tuning the medium.

19. The optical device of claim 18 wherein said means changes the direction of internally reflected light in said optical waveguide incident on angular gratings formed in said periodic perturbation region.

20. The optical device of claim 19 wherein said means is a prism-shaped pattern which may be electrically or thermally pumped.

21. The optical device of claim 1 wherein a portion of said preferential coupling region is not electrically pumped.

22. The optical device of claim 1 further comprising a plurality of spatially aligned light emitters.

23. The optical device of claim 1 wherein said medium comprises a semiconductor laser having opposed cavity facets forming a laser optical resonant cavity, said preferential coupling region in proximity to one of said facets allowing preferential coupling of light propagating in said coupled waves into said first incident propagating wave thereby reducing light lost into said second incident propagating wave.

24. The optical device of claim 23 wherein an angle of said boundary relative to the planar extent of said one facet is chosen to be collinear with a propagation direction of said second incident propagating wave so that propagating light in said second incident propagating wave will substantially enter said preferential coupling region from said periodic perturbation region in a propagation direction normal to said one facet.

25. An optical medium comprising:
   a first region containing a periodic reflector;
   a second region containing no periodic reflector;
   said first and second regions forming an interface therebetween;

an optical beam propagating within said first and second regions at an angle relative to said periodic reflector but not at normal incidence of said periodic reflector;

said interface having a normal incidence that is at an angle lying between said periodic reflector normal incidence and a direction of propagation of said beam in said second region.

26. An optical device comprising:

a semiconductor laser having a linear mean optical axis defining an optical resonant cavity for substantially confined light propagation between cavity reflectors;

an angular grating provided in at least a portion of said optical resonant cavity forming a grating region, said angular grating disposed at an angle with respect to said linear optical axis causing light to propagate along said optical resonant cavity in two coupled waves incident along said grating region, a first incident propagating wave substantially parallel with respect to said linear mean optical axis and a second incident propagating wave at an angle with respect to said linear mean optical axis;

the improvement comprising at least one region in said optical cavity adjacent to one of said reflectors containing no angular grating, said non-grating region extending from said one reflector and forming a boundary with said grating region.

27. The optical device of claim 26 wherein an angle of said boundary relative to said linear mean optical axis is chosen to be collinear with a propagation direction of said second incident propagating wave so that propagating light in said second incident propagating wave will substantially enter said non-grating region from said grating region at said boundary in a propagation direction substantially parallel with said linear mean optical axis.

28. The optical device of claim 27 wherein said non-grating region is slightly flared to permit divergence of said propagating light.

29. The optical device of claim 26 wherein said optical device is index guiding or gain guiding.

30. A optical device comprising:

a beam of coherent radiation propagating sequentially through a first waveguide region and a second waveguide region, said regions having an interface therebetween;

said second waveguide region comprising a grating having grooves disposed at a first angle with respect to said propagating beam, said grating being absent from said first waveguide region;

the interface between said first and second regions disposed at a second angle with respect to a propagating direction of said propagating beam;

said second angle being greater than said first angle and equal to or less than 90°.

31. The optical device of claim 30 wherein said second angle is about twice said first angle.

32. A coherent radiation source comprising:

at least one beam of light propagating along a given path relative to the source;

a Bragg grating comprising a plurality of periodic reflective means that interact with and deflect said beam of light within the source;

said reflective means disposed at a first angle $\theta_1$ to said given path;

a boundary of said grating lying in said given path, at least a portion of said boundary disposed at a second angle $\theta_2$ to said given path such that $90° > \theta_2 > \theta_1 > 0°$.

33. The coherent radiation source of claim 32 wherein said source includes a reflector disposed perpendicularly to said given path.

34. The coherent radiation source of claim 32 wherein said second angle $\theta_2$ is substantially equal to twice said first angle $\theta_1$.

35. The coherent radiation source of claim 34 wherein said source includes a reflector disposed perpendicularly to said given path.

36. The coherent radiation source of any one of claims 32 wherein said given path is located within a planar waveguide structure.

37. The coherent radiation source of claim 32 wherein said source comprises a semiconductor gain medium.

38. The coherent radiation source of claim 37 wherein said semiconductor gain medium comprises a semiconductor laser, semiconductor amplifier or a passive grating region.

39. The coherent radiation source of claim 32 further comprising two reflective means forming a laser resonator.

40. A semiconductor laser device comprising:

a gain region formed in said device, said gain region having a first light containing region coupled at an interface to a second light containing region;

a grating structure formed in said device and having an elongated axial direction;

said first light containing region including at least a portion of said grating structure;

said second light containing region not containing said grating structure;

reflective means bordering said second light containing region opposite to said interface, said grating structure axial direction disposed at a first angle ($\theta_1$) relative to said reflector;

at least a portion of said interface being disposed along a plane at a second angle ($\theta_2$) relative to said reflector, said second angle ($\theta_2$) less than 90°.

41. The semiconductor laser device of claim 40 wherein said first angle ($\theta_1$) is twice that of said second angle ($\theta_2$).

42. The semiconductor laser device of claim 40 wherein said interface portion is disposed at a third angle ($\theta_3$) from said grating structure axial direction so that $\theta_3 < \theta_1$.

43. The semiconductor laser device of claim 42 wherein said second angle ($\theta_2$) and said third angle ($\theta_3$) equal to said first angle ($\theta_1$).

44. The semiconductor laser device of claim 40 wherein said reflector means is a laser facet.

45. A semiconductor laser device comprising:

a light reflector extending along a first plane;

a grating extending along a second plane at an angle to said first plane which is not of normal incidence with respect to said first plane;

light propagating along a path that interacts with at least a portion of said grating and being at least partially deflected by said grating;

a boundary formed along a third plane that intersects said light path, at least a portion of said boundary third plane disposed at an angle to said grating second plane and to said reflector first plane that is within a range of angles between said reflector first plane and said grating second plane.

46. A coherent radiation source comprising:

a substantially collimated beam of light propagating along a given path relative to the source;

a Bragg grating comprising a plurality of substantially parallel grooves formed in said source having deflecting surfaces that interact with and deflect said beam of light within the source;

said grating grooves disposed at a first angle ($\theta_1$) to a plane normal to said given path;

a boundary of said grating lying in said given path, at least a portion of said boundary disposed at a second angle ($\theta_2$) to said plane such that $\theta_1 > \theta_2 > 0$.

47. The coherent radiation source of claim 46 wherein said plane includes a reflector.

48. The coherent radiation source of claim 46 further comprising a planar waveguiding structure formed in the source along the direction of said given path.

49. The coherent radiation source of claim 46 wherein said source comprises a semiconductor gain medium.

50. The coherent radiation source of claim 49 wherein said semiconductor gain medium comprises a semiconductor laser, semiconductor amplifier or a passive waveguide.

51. A coherent radiation source comprising:

at least one active region for generating radiation;

first and second reflective means defining a resonant cavity therebetween, generated radiation propagating along a path between said reflective means;

said resonant cavity having at least two parts comprising a first part including distributive reflective means disposed at angle to said first and second reflective means within at least a portion of said first part for interacting and laterally deflecting portions of the propagating radiation along said path and a second part formed between one of said reflective means and a boundary formed between said first and second parts, said second part not containing said distributive reflective means;

said boundary disposed at an angle relative to said one reflective means such that laterally deflected propagating light in said first part when crossing said boundary toward said one reflective means is oriented at said boundary to be substantially perpendicular to a plane of said one reflective means.

52. The coherent radiation source of claim 51 wherein said orientation is caused by diffraction.

53. The coherent radiation source of claim 51 wherein said distributive reflective means comprises a grating formed in proximity to said active region.

54. The coherent radiation source of claim 53 wherein said grating is periodic.

55. The coherent radiation source of claim 53 wherein said grating comprises a plurality of grooves.

56. The coherent radiation source of claim 51 wherein a further second part is also formed between the other of said reflective means and a boundary formed between said first and further second parts, said further second part not containing said distributive reflective means.

57. The coherent radiation source of claim 51 wherein a portion of radiation directed by said boundary toward said one reflective means is reflected by said one reflective means back into said path while the remaining portion thereof is transmitted through said one reflective means.

58. A coherent radiation source comprising:

at least one beam of light propagating in a cavity along a given path within the source between end faces of the cavity;

at least a first portion of the propagating path including a Bragg grating, said grating formed at a first angle relative to said cavity end faces;

at least a second portion of the propagating path formed between one of said end faces and said grating portion; and an angular interface formed between said first and second portions, at a second angle relative to said cavity end faces, said second smaller than said first angle.

59. A laser source system comprising:

an angled grating laser source having an optical cavity with an angled Bragg grating in a first portion of said cavity for selecting, in combination, a single spatial mode and a single lasing frequency light as an output from said source, said light propagating in said first portion as first and second wave components;

at least one preferential coupling region in a second portion of said optical cavity of said source between said first portion and said output, said coupling region absent of said angled Bragg grating and for coupling light propagating in said first portion into one of said propagating wave components;

a nonlinear frequency conversion device having a characteristic wavelength in optical communication with the laser source;

said output from said laser optically coupled to said nonlinear frequency conversion device wherein said single lasing frequency is selected by said angled Bragg grating to at least approximately match the characteristic wavelength of said nonlinear frequency conversion device.

60. The laser source system of claim 59 wherein either the lasing frequency or the characteristic wavelength of the frequency conversion device is temperature tuned to maximize the converted light output.

61. The laser source system of claim 59 wherein angular incidence of said laser source output relative to coupling to said nonlinear frequency conversion device is adjusted to match the laser frequency to approximately match the characteristic wavelength of said waveguide device.

62. The laser source system of claim 59 wherein said nonlinear frequency conversion device is a frequency doubler.

63. The laser source system of claim 59 wherein said nonlinear frequency conversion device is a nonlinear crystal.

64. The laser source system of claim 63 wherein a waveguide formed in said nonlinear crystal receives said propagating light.

65. The laser source system of claim 63 wherein the crystal bulk of said nonlinear crystal receives said propagating light.

66. The laser source system of claim 59 further comprising at least one preferential coupling region in said optical cavity, said preferential coupling region forming a boundary with said angled Bragg grating, an angle of said boundary relative to a mean optical path chosen to be collinear with a propagation direction of one of two incident propagating waves produced by said angled Bragg grating so that propagating light in said one incident propagating wave will substantially enter said preferential coupling region from said grating via said boundary in a propagation direction substantially parallel with the mean optical axis.

67. The optical device of claim 66 wherein said preferential coupling region is light diverging region.

68. The optical device of claim 66 wherein said preferential coupling region does not contain said angular grating.

69. A semiconductor laser comprising:

an optical cavity having feedback for stimulated laser emission including at least one mirror, said cavity having a first portion which contains a grating such that light propagating along said cavity has non-perpendicular incidence with said grating; and a second portion of said optical cavity in the vicinity of said one mirror forming a wider region than said grating portion.

70. The semiconductor laser of claim 69 wherein said grating does not extend into said second portion does not contain said grating.

71. The semiconductor laser of claim 69 wherein a boundary formed between said first and second portions of said optical cavity is formed at an angle with respect to both said one mirror and said grating.

72. The semiconductor laser of claim 71 wherein a widest portion of said second portion is adjacent to said mirror.

73. The semiconductor laser of claim 72 wherein the widest portion is collinear with said mirror.

74. A semiconductor laser comprising:
   an active region for light generation when electrically excited and propagating in an optical cavity;
   reflective means for providing feedback in said optical cavity;
   an optical grating in at least a portion of said optical cavity wherein light propagating in said optical cavity propagates at a non-normal incidence to said optical grating into two different wave components; and
   at least one other portion of said optical cavity optically coupled to said grating portion of said optical cavity for receiving light propagating in said grating portion for permitting the coupling of one of said two wave components into the other of said wave components.

75. The semiconductor laser of claim 74 wherein said other portion is also electrically excited.

76. The semiconductor laser of claim 75 wherein a width of said other portion is wider than any other portion of said optical cavity.

77. The semiconductor laser of claim 76 wherein said reflective means further comprises at least one mirror in said optical cavity, the widest portion of said other portion positioned adjacent to said mirror.

78. The semiconductor laser of claim 74 wherein said reflective means further comprises cavity end mirrors in said optical cavity, said other portion is formed in the vicinity of one of said mirrors.

79. The semiconductor laser of claim 74 wherein said optical grating is not present in said other portion.

80. The semiconductor laser of claim 74 wherein said other portion comprises a triangular-shaped or trapezoidal-shaped region.

81. The semiconductor laser of claim 74 wherein the electrical density in said other portion is different from other portions of said optical cavity.

82. The semiconductor laser of claim 81 wherein the current density is higher in said other portion.

83. An optical device for propagation, in part, of a first wave $\vec{U}$ and a second wave $\vec{V}$ comprising:
   a first region in said device having a coupling structure in which the first wave has unit vector $\vec{U}$ and the second wave has unit vector $\vec{V}$ and are coupled into one another as they propagate along the first region; and
   a second region without the coupling structure into which only one of the waves associated with unit vectors $\vec{U}$ or $\vec{V}$ is preferentially coupled.

84. The optical device of claim 83 further comprising an interface between the first and second regions defined by a surface normal unit vector $\vec{S}$ such that the product of $|\vec{V} \cdot \vec{S}|$ is substantially near or is equal to 0 and $|\vec{U} \cdot \vec{V}| \neq 0$.

85. The optical device of claim 84 wherein the product of $|\vec{V} \cdot \vec{S}|$ is no greater than 0.1.

86. The optical device of claim 84 wherein the product of $|\vec{V} \cdot \vec{S}|$ is no greater than 0.5.

87. A method of coupling light propagating in an optical device in at least two different waves, respectively propagating in first and second directions in a direction of a mean optical axis, into a single preferred light propagation direction, comprising the steps of:
   directing the waves through a first optical region having a coupling structure causing either of the waves to interact with the structure and couple mutually one into the other as they propagate in the direction of the mean optical axis;
   providing an interface disposed at an angle transverse to the mean optical axis for intercepting the mutually coupling waves and causing only first of the waves to pass through the interface with a substantial portion of the second wave being coupled into the first wave at or near the interface; and
   directing thereafter the first wave through a second optical region absent the coupling structure such that the first wave cannot again couple back into the second wave in the second optical region, the direction of propagation of the first wave in the second region comprising the single preferred light propagation direction.

88. The method of claim 87 comprising the further step of defining the angle of the interface between the first second optical regions relative to the mean optical axis to be substantially parallel to the propagation direction of the second wave.

* * * * *